(12) United States Patent  (10) Patent No.: US 8,147,664 B2
Yamaguchi et al.  (45) Date of Patent: Apr. 3, 2012

(54) SPUTTERING APPARATUS

(75) Inventors: Nobuo Yamaguchi, Tama (JP); Kazuaki Matsuo, Inagi (JP); Susumu Akiyama, Tokyo (JP); Yukihiro Kobayashi, Odawara (JP)

(73) Assignee: Canon Anelva Corporation, Kawasaki-shi (JP)

( * ) Notice: Subject to any disclaimer, the term of this patent is extended or adjusted under 35 U.S.C. 154(b) by 182 days.

(21) Appl. No.: 12/787,506

(22) Filed: May 26, 2010

(65) Prior Publication Data

US 2010/0243438 A1 Sep. 30, 2010

Related U.S. Application Data

(63) Continuation of application No. PCT/JP2009/006347, filed on Nov. 25, 2009.

(30) Foreign Application Priority Data

Nov. 28, 2008 (JP) .................................. 2008-305566

(51) Int. Cl.
C23C 14/34 (2006.01)
(52) U.S. Cl. .............................. 204/298.11; 204/298.15
(58) Field of Classification Search ............. 204/298.11, 204/298.15; 118/720, 721, 504; 156/345.3
See application file for complete search history.

(56) References Cited

U.S. PATENT DOCUMENTS

| 2008/0264775 | A1 | 10/2008 | Kitano et al. ............... 204/192.1 |
| 2009/0166195 | A1 | 7/2009 | Kobayashi et al. ...... 204/298.11 |

FOREIGN PATENT DOCUMENTS

| JP | 3119563 | 5/1991 |
| JP | 06-299355 | 10/1994 |
| JP | 08-078791 | 3/1996 |
| JP | 08-269705 | 10/1996 |
| JP | 10-140338 | 5/1998 |
| JP | 10-183332 | 7/1998 |
| JP | 2002-302763 | 10/2002 |
| WO | 2007/066511 | 6/2007 |

*Primary Examiner* — Rodney McDonald
(74) *Attorney, Agent, or Firm* — Fitzpatrick, Cella, Harper & Scinto

(57) ABSTRACT

A sputtering apparatus includes a target holder which is placed in a vacuum vessel and can hold a target configured to deposit a film on a substrate, a substrate holder which can mount the substrate, a first shield member which is disposed in a vicinity of the substrate holder, and configured to form a closed state in which the substrate holder and the target holder are shielded from each other, or an open state in which the substrate holder and the target holder are opened to each other, a first opening/closing driving unit adapted to open/close the first shield member to enter the open state or the closed state, a second shield member, having an annular-shaped, disposed on the surface of the substrate holder and an outer peripheral portion of the substrate, and a driving unit adapted to move the substrate holder in order to bring the substrate holder, on which the second shield member is disposed, close to the first shield member in the closed state. The first shield member has at least one annular-shaped, first protruding portion formed on it to extend in the direction of the second shield member. The second shield member has at least one annular-shaped, second protruding portion formed on it to extend in the direction of the first shield member. The first protruding portion and the second protruding portion fit together in a non-contact state at the position up to which the driving unit brings the substrate holder close to the first shield member.

12 Claims, 22 Drawing Sheets

F I G. 2
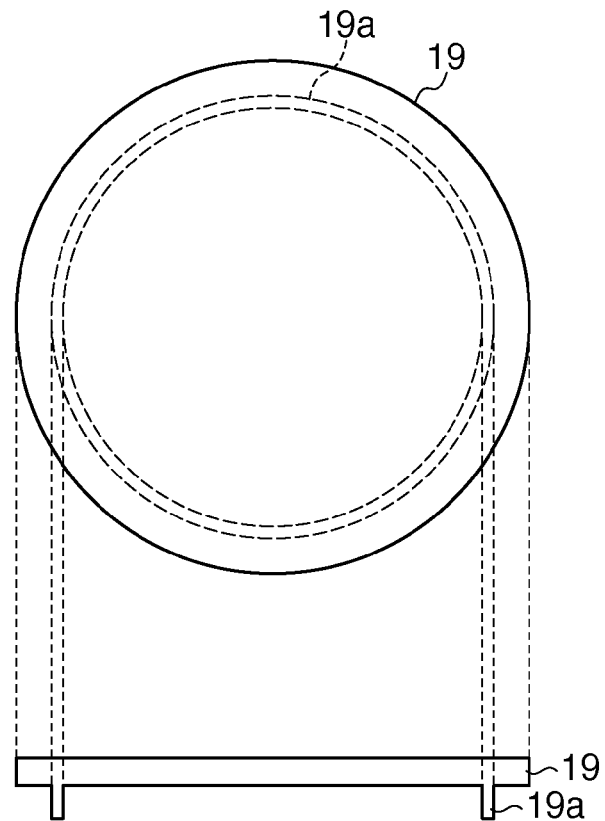
F I G. 3
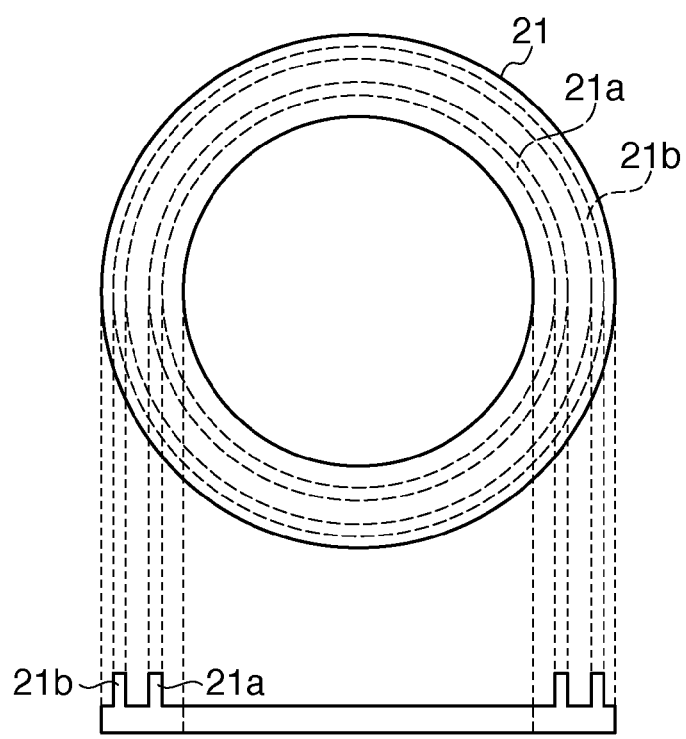

SPUTTERING APPARATUS

CROSS-REFERENCE TO RELATED APPLICATION

This application is a continuation of International Application No. PCT/JP2009/006347, filed on Nov. 25, 2009, which claims the benefit of Japanese Patent Application No. 2008-305566, filed on Nov. 28, 2008. The contents of the aforementioned applications are incorporated herein by reference in their entireties.

TECHNICAL FIELD

The present invention relates to a sputtering apparatus used to deposit a material on a substrate in a process of manufacturing, for example, a semiconductor device or a magnetic storage medium.

BACKGROUND ART

A sputtering apparatus which deposits a thin film on a substrate includes an evacuated vacuum vessel, a target holder which holds a vapor deposition source called a target made of a material to be deposited on the substrate in the vacuum vessel, and a substrate holder which supports the substrate in the vacuum vessel. In a process of depositing a thin film on the substrate, the sputtering apparatus introduces a gas such as Ar into the vacuum vessel, and applies a high voltage to the target, thereby generating a plasma. A phenomenon in which charged particles in the discharge plasma sputter the target is exploited to allow the target material to adhere onto the substrate supported by the substrate holder.

When positive ions in a plasma strike a target material with a negative potential, atoms and molecules in the target material are ejected from the target material. These atoms and molecules are commonly called sputtering particles. The sputtering particles adhere onto the substrate to form a film containing the target material on it. The sputtering apparatus typically includes a freely openable/closable shield plate called a shutter, which is inserted between the target material and the substrate.

The shutter is used mainly for the following three purposes. First, the shutter is used to prevent sputtering particles from scattering until the discharge stabilizes. More specifically, the sputtering apparatus does not generate a plasma simultaneously with high-voltage application but normally encounters the following phenomena. For example, a plasma is generated with a delay of about 0.1 sec after voltage application, is not generated even after voltage application, or is generated but is unstable immediately after the start of discharge. These phenomena make it impossible to deposit a film with a stable thickness and quality. To circumvent this problem, the shutter is used for so-called pre-sputtering, in which discharge starts while the shutter is closed, and the shutter is opened after the discharge stabilizes so that sputtering particles are deposited on the substrate.

Second, the shutter is used to perform conditioning. The conditioning means discharge which does not aim at depositing a film on the substrate but aims at stabilizing the deposition characteristics.

For example, before the start of continuous deposition to yield a product, discharge is performed under the same conditions as continuous deposition conditions in order to stabilize the atmosphere in the vacuum vessel. Especially in a reactive sputtering method of introducing a reactive gas such as nitrogen or oxygen or a mixture of a reactive gas and Ar into the vacuum vessel to deposit a nitride or oxide of the target material on the substrate, it is important for stable deposition to keep the inner surface of the vacuum vessel in the same state as the state in which continuous deposition is performed.

However, sputtering particles adhere not only onto the inner surface of the vacuum vessel but also onto the substrate mounting surface of the substrate holder. To prevent this, discharge is performed after an inert gas and a reactive gas are introduced into the vacuum vessel while preventing a film from adhering onto the substrate mounting surface of the substrate holder by closing a shutter disposed in a vicinity of the substrate holder so as to shield the substrate mounting surface when viewed from the sputtering surface and so as not to shield the inner surface of the vacuum vessel. With this operation, a nitride or an oxide adheres onto the inner surface of the vacuum vessel. The quality of a thin film to be deposited can be stabilized by starting deposition on the substrate after a nitride or an oxide adheres onto the inner surface of the vacuum vessel in sufficient quantity in advance.

Conditioning is also often performed as discharge under conditions different from the production conditions in the process of continuous deposition to yield a product. This applies to a case in which, for example, a film with a strong stress is continuously deposited on the substrate by the reactive sputtering method, so a film adhering on, for example, a deposition shield in the vacuum vessel peels off and becomes a particle. To prevent this, a metal film is often periodically deposited using a nonreactive sputtering method. For example, conditioning of Ti deposition is periodically performed in continuous TiN deposition. When only TiN is continuously deposited, a TiN film adhering on, for example, the deposition shield in the vacuum vessel peels off. However, this phenomenon can be prevented by periodically performing conditioning of Ti deposition.

Third, the shutter is used to sputter a contaminated or oxidized target surface in advance to remove the contaminated or oxidized portion of the target before continuous deposition to yield a product. More specifically, a target is shaped by machining using, for example, a lathe in the final process of manufacturing the target. At this time, contaminants produced by a grinding tool adhere onto the target surface, or the target surface oxidizes during transportation of the target. This makes it necessary to sufficiently sputter the target surface before deposition to expose a clean target surface. In this case, the shutter is used for so-called target cleaning in which the target is sputtered while the shutter is closed so as to prevent contaminated or oxidized target particles from adhering onto the substrate mounting surface of the substrate holder.

Against a backdrop of the recent demand for an improvement in performance of devices, the following problem is posed. A target material which has adhered onto the lower surface of a semiconductor substrate in a sputtering process peels off or is carried to the subsequent processes and contaminates apparatuses in the subsequent processes, thus degrading the device performance. Note that contamination of other apparatuses through the medium of the lower surface of the substrate must be strictly controlled because it has a considerable adverse effect on the device performance even when the amount of adhesion of the target material onto the surface of the substrate holder in its portion where the substrate is placed is as very small as about, for example, $1 \times 10^{11}$ atms/cm$^2$.

This problem is encountered because there are gaps around the shutter even when the shutter is closed and they pass a small amount of sputtering particles. That is, sputtering particles adhere onto the substrate holder during conditioning or target cleaning. If the amount of adhesion is considerable, a film is deposited on the substrate holder. The deposited film not only contaminates the substrate upon adhering onto the lower surface of the substrate but also contaminates other manufacturing apparatuses as it is transported to the next process.

To circumvent the problem that sputtering particles land on the substrate mounting surface during target cleaning or pre-sputtering, PLT1, for example, discloses a technique of surrounding the target with a cylindrical cathode cover, and inserting a shutter into the opening in the cathode cover. This method is effective as a means for preventing sputtering particles from landing on the substrate mounting surface.

Also, PLT2 and PLT3 each disclose an apparatus including two shutters inserted between a substrate and a target or between the substrate and a vapor deposition source.

CITATION LIST

Patent Literature

PLT1: Japanese Patent Laid-Open No. 8-269705
PLT2: Japanese Patent Laid-Open No. 2002-302763
PLT3: Japanese Patent Laid-Open No. 8-78791

SUMMARY OF INVENTION

Technical Problem

Unfortunately, in the apparatus disclosed in PLT1, when discharge is performed while the shutter is in contact with the cylindrical cover, a film which has adhered onto the shutter upon opening/closing the shutter comes into contact with the top of the cylindrical cover, so it peels off and becomes a particle. Furthermore, a film inevitably adheres onto the contact portion between the shutter and the cylindrical cover, so the film near the contact portion cracks, peels off, and becomes a particle the moment the shutter and the cylindrical cover are separated from each other. This makes it difficult to open/close the shutter without producing any particle. To prevent generation of such a particle, it is necessary to space the cylindrical cover and the shutter apart from each other to a small extent that they do not come into contact with each other. This makes it impossible to prevent sputtering particles from landing on the substrate mounting surface at an atomicity level.

Furthermore, although PLT2 and PLT3 have the advantage of being able to start deposition in a stable state, they do not solve the problem that sputtering particles land on the substrate mounting surface of the substrate holder at the recently required micro-level.

The conventional methods are unsatisfactory in contamination prevention at the recently required level.

Solution to Problem

The present invention has been made in consideration of the above-described problems of the prior arts, and has as its object to provide a sputtering apparatus which prevents sputtering particles from adhering onto the substrate mounting surface of a substrate holder upon discharge aiming at conditioning, pre-sputtering, and target cleaning.

In order to achieve the above-described object, according to the present invention, there is provided a sputtering apparatus comprising:

a target holder which is placed in a vacuum vessel and can hold a target configured to deposit a film on a substrate;
a substrate holder which can mount the substrate;
a first shield member which is disposed in a vicinity of the substrate holder, and configured to form a closed state in which the substrate holder and the target holder are shielded from each other, or an open state in which the substrate holder and the target holder are opened to each other;
a first opening/closing driving unit adapted to open/close the first shield member to enter the open state or the closed state;
a second shield member, having an annular-shaped, disposed on a surface of the substrate holder and an outer peripheral portion of the substrate; and
a driving unit adapted to move the substrate holder in order to bring the substrate holder, on which the second shield member is disposed, close to the first shield member in the closed state,
wherein the first shield member has at least one annular-shaped, first protruding portion formed thereon to extend in a direction of the second shield member, the second shield member has at least one annular-shaped, second protruding portion formed thereon to extend in a direction of the first shield member, and
the first protruding portion and the second protruding portion fit together in a non-contact state at a position up to which the driving unit brings the substrate holder close to the first shield member.

Alternatively, according to the present invention, there is provided a sputtering apparatus comprising:

a target holder which is placed in a vacuum vessel and can hold a target configured to deposit a film on a substrate;
a substrate holder which can mount the substrate;
a first shield member which is disposed in a vicinity of the substrate holder, and configured to form a closed state in which the substrate holder and the target holder are shielded from each other, or an open state in which the substrate holder and the target holder are opened to each other;
a first opening/closing driving unit adapted to open/close the first shield member to enter the open state or the closed state;
a second shield member, having an annular-shaped, disposed on a surface of the substrate holder and an outer peripheral portion of the substrate; and
a driving unit adapted to move the first shield member in order to bring the first shield member in the closed state, close to the substrate holder on which the second shield member is disposed,
wherein the first shield member has at least one annular-shaped, first protruding portion formed thereon to extend in a direction of the second shield member, the second shield member has at least one annular-shaped, second protruding portion formed thereon to extend in a direction of the first shield member, and
the first protruding portion and the second protruding portion fit together in a non-contact state at a position up to which the driving unit brings the first shield member close to the substrate holder.

ADVANTAGEOUS EFFECTS OF INVENTION

According to the present invention, it is possible to provide a sputtering apparatus which prevents sputtering particles from adhering onto the substrate mounting surface of a substrate holder upon discharge aiming at conditioning, presputtering, and target cleaning.

Other features and advantages of the present invention will be apparent from the following descriptions taken in conjunction with the accompanying drawings, in which like reference characters designate the same or similar parts throughout the figures thereof.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 2 is a view schematically showing a substrate shutter 19 facing a substrate outer cover ring 21;

FIG. 3 is a view schematically showing the substrate outer cover ring 21 facing the substrate shutter 19;

DESCRIPTION OF EMBODIMENTS

Exemplary preferred embodiments of the present invention will be described in detail below with reference to the accompanying drawings. However, constituent components described in these embodiments are merely examples, and the technical scope of the present invention is determined by the scope of claims and is not limited to the following individual embodiments.

Figure 1A:
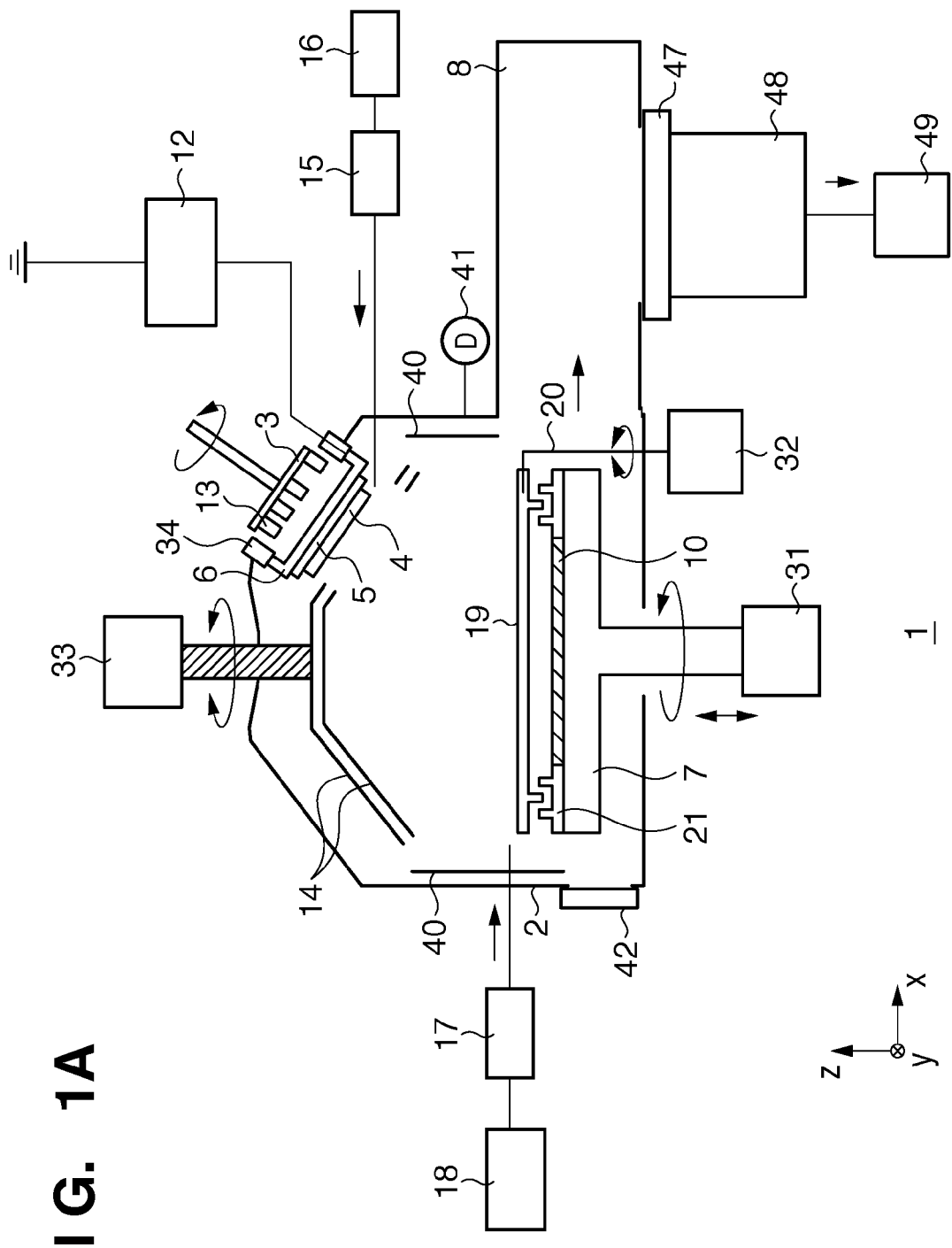
FIG. 1A is a schematic view showing a deposition apparatus 1 according to an embodiment of the present invention.

The entire arrangement of a sputtering apparatus (to be also referred to as a "deposition apparatus" hereinafter) will be described with reference to FIGS. 1A, 1B, 2, and 3. FIG. 1A is a schematic view showing a deposition apparatus 1 according to an embodiment of the present invention. The deposition apparatus 1 includes a vacuum vessel 2, a vacuum exhaust device, an inert gas introduction system 15 which can introduce an inert gas into the vacuum vessel 2, and a reactive gas introduction system 17 which can introduce a reactive gas into the vacuum vessel 2. The vacuum exhaust device includes a turbo molecular pump 48 which evacuates the vacuum vessel 2 through an exhaust port 8, and a dry pump 49.

The exhaust port 8 is, for example, a conduit with a rectangular cross-section, and connects the vacuum vessel 2 and the turbo molecular pump 48 to each other. A main valve 47 for disconnecting the deposition apparatus 1 and the turbo molecular pump 48 from each other prior to maintenance is inserted between the exhaust port 8 and the turbo molecular pump 48.

The inert gas introduction system 15 is connected to an inert gas supply device (gas cylinder) 16 for supplying an inert gas. The inert gas introduction system 15 includes, for example, a pipe for introducing an inert gas, a mass flow controller for controlling the flow rate of the inert gas, various types of valves for starting/stopping gas supply, and a pressure reducing valve and a filter as needed. Hence, the inert gas introduction system 15 can stably supply a gas at a flow rate designated by a control device (not shown). An inert gas is supplied from the inert gas supply device 16, has its flow rate controlled by the inert gas introduction system 15, and is introduced to a vicinity of a target 4 (to be described later).

The reactive gas introduction system 17 is connected to a reactive gas supply device (gas cylinder) 18 for supplying a reactive gas. The reactive gas introduction system 17 includes, for example, a pipe for introducing a reactive gas, a mass flow controller for controlling the flow rate of the reactive gas, various types of valves for starting/stopping gas supply, and a pressure reducing valve and a filter as needed. Hence, the reactive gas introduction system 17 can stably supply a gas at a flow rate designated by a control device (not shown).

A reactive gas is supplied from the reactive gas supply device 18, has its flow rate controlled by the reactive gas introduction system 17, and is introduced to the vicinity of a substrate holder 7 which holds a substrate 10 (to be described later).

After the inert gas and the reactive gas are introduced into the vacuum vessel 2, they generate sputtering particles or are used to form a film, as will be described later, pass through the exhaust port 8, and are exhausted by the turbo molecular pump 48 and dry pump 49.

The vacuum vessel 2 accommodates a target holder 6 which holds the target 4 having an exposed sputtering surface through a backplate 5, and the substrate holder 7 which holds the substrate 10 at a predetermined position where sputtering particles ejected from the target 4 reach. The vacuum vessel 2 also accommodates a pressure gauge 41 for measuring the pressure in the vacuum vessel 2. The inner surface of the vacuum vessel 2 is grounded. A grounded cylindrical shield 40 (deposition shield member) is disposed on the inner surface of the vacuum vessel 2 between the target holder 6 and the substrate holder 7. The shield 40 (deposition shield member) prevents sputtering particles from directly adhering onto the inner surface of the vacuum vessel 2.

Magnets to implement magnetron sputtering are arranged at the back of the target 4 when viewed from the sputtering surface. The magnets 13 are held by a magnet holder 3 and can be rotated by a magnet holder rotating mechanism (not shown). The magnets 13 rotate during discharge in order to uniform erosion of the target.

The target 4 is located at a position (offset position) obliquely above the substrate 10. That is, the central point on the sputtering surface of the target 4 is present at a position shifted by a predetermined dimension with respect to a normal to the central point on the substrate 10. The target holder 6 is connected to a power supply 12 for supplying sputtering discharge power. Although the deposition apparatus 1 shown in FIG. 1A includes a DC power supply, the power supply 12 is not limited to this, and the deposition apparatus 1 may include, for example, an RF power supply. When an RF power supply is used, a matching box needs to be inserted between the power supply 12 and the target holder 6.

The target holder 6 is insulated from the vacuum vessel 2 by an insulator 34. Also, since the target holder 6 is made of a metal such as Cu, it serves as an electrode upon being supplied with DC or RF power. Note that the target holder 6 includes a water channel (not shown) and can be cooled by cooling water supplied from a water pipe (not shown). The target 4 is made of a material containing a component to be deposited on a substrate, as is well known. The target 4 is desirably made of a high-purity material, because its material influences the purity of the deposited film. The backplate 5 inserted between the target 4 and the target holder 6 is made of a metal such as Cu and holds the target 4.

Target shutters 14 are disposed in the vicinity of the target holder 6 so as to cover it. The target shutters 14 have a double rotary shutter structure including two independently openable/closable shutter members. The target shutters 14 function as a shield member (third shield member) for forming a closed state in which the substrate holder 7 and the target holder 6 are shielded from each other, or an open state in which they are opened to each other. Also, the target shutters 14 include a target shutter driving mechanism 33 so as to separately open/close the double shutters.

An annular-shaped, second shield member (to be also referred to as a "substrate outer cover ring 21" hereinafter) is disposed on the outer edge (outer periphery) of that portion of the surface of the substrate holder 7, which mounts the substrate 10. The substrate outer cover ring 21 prevents sputtering particles from adhering onto portions other than the deposition surface of the substrate 10 placed on the substrate holder 7. Note that the portions other than the deposition surface include not only the surface of the substrate holder 7 covered with the substrate outer cover ring 21, but also the side and lower surfaces of the substrate 10. The substrate holder 7 includes a substrate holder driving mechanism 31 for vertically moving the substrate holder 7 and rotating it at a predetermined speed. The substrate holder driving mechanism 31 can vertically move the substrate holder 7 in order to lift the substrate holder 7 toward a substrate shutter 19 (first shield member) in a closed state or to lower it with respect to the substrate shutter 19 (first shield member).

The substrate shutter 19 is interposed between the substrate holder 7 and the target holder 6 in the vicinity of the substrate 10. The substrate shutter 19 is supported by a substrate shutter support member 20 so as to cover the surface of the substrate 10. A substrate shutter driving mechanism 32 rotates the substrate shutter support member 20 to insert the substrate shutter 19 into the space between the target 4 and the substrate 10 at a position near the substrate surface (closed state). The target 4 and the substrate 10 are shielded from each other by inserting the substrate shutter 19 into the space between the target 4 and the substrate 10. Also, when the substrate shutter driving mechanism 32 operates to retract the substrate shutter 19 from the space between the target holder 6 (target 4) and the substrate holder 7 (substrate 10), the target holder 6 (target 4) and the substrate holder 7 (substrate 10) are opened to each other (open state). The substrate shutter driving mechanism 32 opens/closes the substrate shutter 19 in order to form a closed state in which the substrate holder 7 and the target holder 6 are shielded from each other, or an open state in which they are opened to each other.

The substrate shutter 19 is configured to be retractable into the exhaust port 8. The position to which the substrate shutter 19 retracts preferably falls within the conduit in the exhaust path up to the turbo molecular pump 48 for use in high-vacuum exhaust so as to reduce the apparatus footprint.

The substrate shutter 19 is made of stainless steel or an aluminum alloy. Alternatively, the substrate shutter 19 is often made of titanium or a titanium alloy to ensure a required heat resistance. At least the surface, facing the target 4, of the substrate shutter 19 has a minute three-dimensional structure formed on it by blasting such as sandblasting. This makes it possible to prevent a film adhering on the substrate shutter 19 from peeling off, thus reducing particles produced upon the peel-off. In addition to blasting, a thin metal film may be formed on the surface of the substrate shutter 19 by, for example, metal spraying. In this case, spraying entails a cost higher than when only blasting is used, but has the advantage that a film adhering on the substrate shutter 19 need only be peeled off, together with the sprayed film, during maintenance in which the substrate shutter 19 is detached and the adhering film is peeled off. Still better, spraying has the effect of preventing the film from peeling off as a stress acting on the sputtered film is released by the sprayed thin film.

The shapes of the substrate outer cover ring 21 and substrate shutter 19 will be described in detail next with reference to FIGS. 2 and 3. FIG. 3 is a view schematically showing the substrate outer cover ring 21 facing the substrate shutter 19. Annular-shaped, protruding portions are formed on the substrate outer cover ring 21 to extend in the direction of the substrate shutter 19. In this manner, the substrate outer cover ring 21 has a ring shape, and concentric protruding portions (protrusions 21a and 21b) are formed on the surface, facing the substrate shutter 19, of the substrate outer cover ring 21.

FIG. 2 is a view schematically showing the substrate shutter 19 facing the substrate outer cover ring 21. An annular-shaped, protruding portion is formed on the substrate shutter 19 to extend in the direction of the substrate outer cover ring 21. A protruding portion (protrusion 19a) is formed on the surface, facing the substrate outer cover ring 21, of the substrate shutter 19. Note that the protrusions 21a, 19a, and 21b are formed to have larger circumferences in this order.

At the position to which the substrate holder driving mechanism 31 lifts the substrate holder 7, the protrusion 19a and the protrusions 21a and 21b fit together in a non-contact state. Alternatively, at the position to which the substrate shutter driving mechanism 32 lowers the substrate shutter 19, the protrusion 19a and the protrusions 21a and 21b fit together in a non-contact state. In this case, the protrusion 19a fits into a groove formed by the plurality of protrusions 21a and 21b in a non-contact state.

Figure 1B:
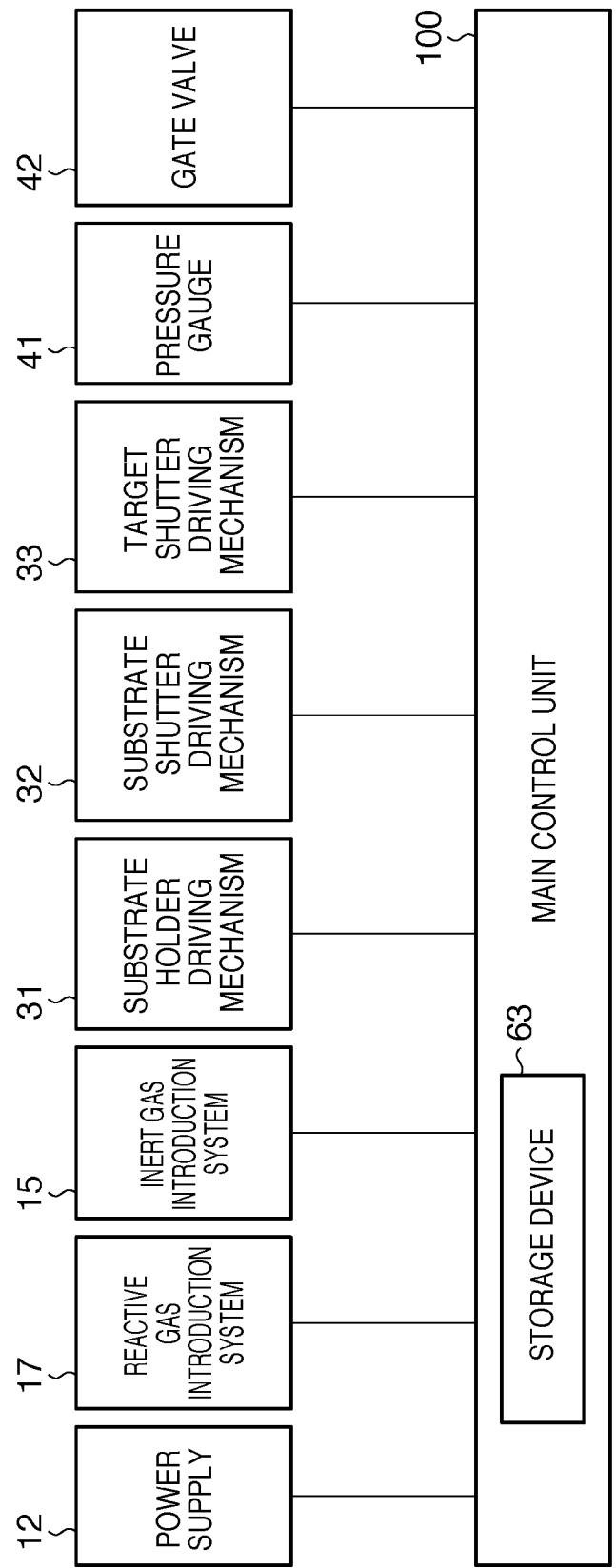
FIG. 1B is a block diagram showing a main control unit 100 for operating the deposition apparatus 1 shown in FIG. 1A.

FIG. 1B is a block diagram showing a main control unit 100 for operating the deposition apparatus 1 shown in FIG. 1A. The main control unit 100 is electrically connected to the power supply 12 for supplying sputtering discharge power, the inert gas introduction system 15, the reactive gas introduction system 17, the substrate holder driving mechanism 31, the substrate shutter driving mechanism 32, the target shutter driving mechanism 33, the pressure gauge 41, and a gate valve. Hence, the main control unit 100 can manage and control the operation of the deposition apparatus (to be described later).

A storage device 63 built in the main control unit 100 stores a control program for executing, for example, a method of depositing a film on a substrate, which includes conditioning and pre-sputtering, according to the present invention. The control program is implemented as, for example, a mask ROM. Alternatively, the control program can be installed on the storage device 63 including, for example, an HDD (Hard Disk Drive) via an external recording medium or a network.

Figure 4A:
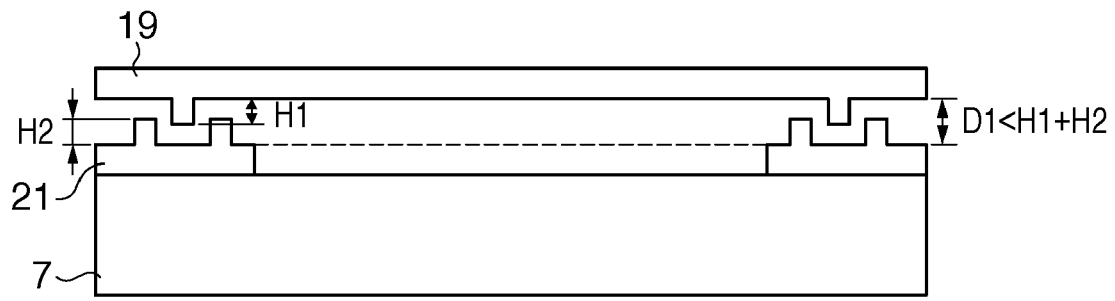
FIG. 4A is a view for explaining the positional relationship between the substrate shutter 19 and the substrate outer cover ring 21.

The positional relationship between the substrate shutter 19 and the substrate outer cover ring 21 will be described next with reference to FIGS. 4A to 4C. FIG. 4A shows the state in which a labyrinth seal has been formed by bringing the substrate shutter 19 and the substrate outer cover ring 21 close to each other to fit together the protruding portions on their surfaces facing each other (this state will be referred to as the "position A" hereinafter). The labyrinth seal mentioned herein is a kind of a non-contact seal, and means the one formed while the protruding portions (a groove formed by the protrusions 21a and 21b and a projection formed by the protrusion 19a) formed on the facing surfaces, respectively, fit together in a non-contact state, that is, with a predetermined gap between the groove and the projection. The opening (gap) between the substrate shutter 19 and the substrate holder 7 is sealed by fitting together the protruding portions (groove and projection). This makes it possible to prevent sputtering particles from adhering onto, for example, the surface of the substrate holder 7.

When the labyrinth seal has been formed (position A), shown in FIG. 4A, a height H1 of the protrusion with respect to the flat surface of the substrate shutter 19, a height H2 of the protrusions with respect to the flat surface of the substrate outer cover ring 21, and a distance D1 between the flat surfaces of the substrate shutter 19 and substrate outer cover ring 21 satisfy a relation:

$$D1 < H1 + H2$$

When the labyrinth seal has been formed at the position A, the three protrusions: the protrusion 19a of the substrate shutter 19 and the substrate outer cover rings 21a and 21b fit together. Conditioning is performed in this state, as will be described later, so it is possible to prevent sputtering particles from adhering onto the surface of the substrate holder 7.

Figure 4B:
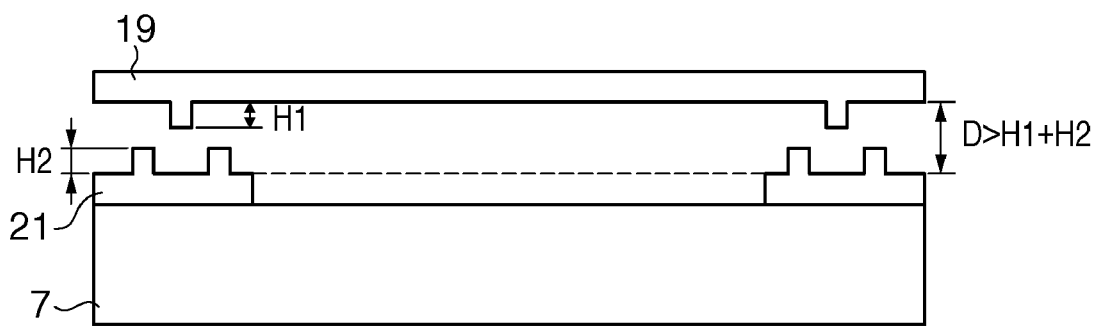
FIG. 4B is a view for explaining the positional relationship between the substrate shutter 19 and the substrate outer cover ring 21.

FIG. 4B shows the state in which the substrate shutter 19 and substrate outer cover ring 21 keep a minimum distance between them, beyond which they come into contact with each other, during opening/closing of the substrate shutter 19 (this state will be referred to as the "position B" hereinafter). At the position B, a relation: D1>H1+H2 is satisfied.

Figure 4C:
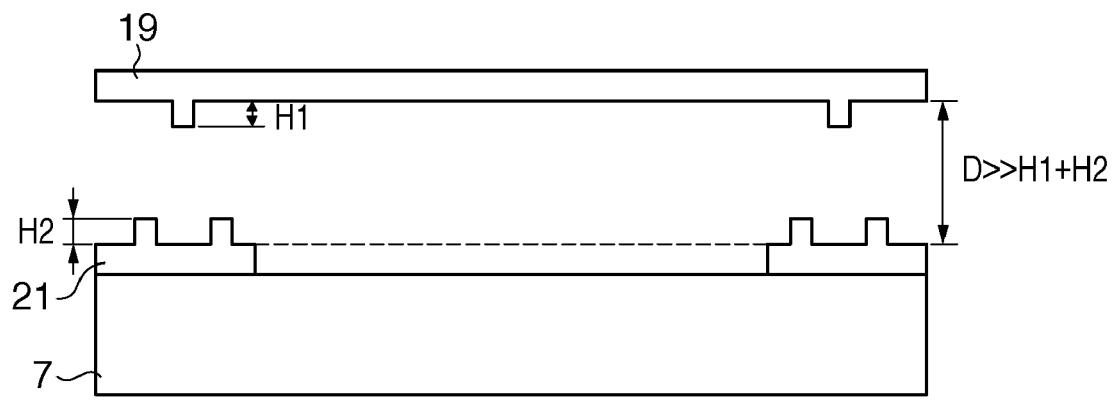
FIG. 4C is a view for explaining the positional relationship between the substrate shutter 19 and the substrate outer cover ring 21.

FIG. 4C shows the state in which the substrate shutter 19 and the substrate holder 7 have a maximum distance between them (this state will be referred to as the "position C" hereinafter). A substrate can be transported onto the substrate mounting surface of the substrate holder 7 via a gap formed between the substrate shutter 19 and the substrate outer cover ring 21 at the position C. Although the position of the substrate outer cover ring 21 is moved by vertically moving the substrate holder 7 to adjust the interval between the substrate shutter 19 and the substrate outer cover ring 21 in this embodiment, the present invention is not limited to this example. For example, the substrate shutter driving mechanism 32 may vertically move the substrate shutter 19. That is, the substrate shutter driving mechanism 32 can vertically move the substrate shutter 19 (first shield member) in order to lower the substrate shutter 19 (first shield member) in a closed state toward the substrate holder 7 on which the substrate outer cover ring 21 (second shield member) is disposed or to lift it with respect to the substrate holder 7.

Alternatively, the substrate shutter driving mechanism 32 and substrate holder driving mechanism 31 can vertically move the substrate shutter 19 and substrate holder 7, respectively, to form the position C.

In this embodiment, the substrate shutter support member 20 opens/closes the substrate shutter 19 by a rotation operation. However, it is also possible to slide the substrate shutter 19 sideways using, for example, a sliding mechanism such as a rail as long as the space between the target 4 and the substrate 10 can be opened/closed. Nevertheless, rotary shutters are more desirable because a sliding mechanism such as a rail, for example, often generates dust upon sliding the substrate shutter 19.

(Operation in Conditioning)

The operation of the deposition apparatus 1 in conditioning will be described next with reference to FIGS. 5A to 5F. The conditioning mentioned herein means processing for performing discharge to stabilize the deposition characteristics to cause the sputtering particles to adhere onto, for example, the inner wall of the chamber while the substrate shutter 19 is closed so as not to adversely affect deposition on a substrate.

First, the main control unit 100 instructs the substrate shutter driving mechanism 32 to close the substrate shutter 19. Next, the main control unit 100 instructs the target shutter driving mechanism 33 to close the target shutters 14. In accordance with the instructions by the main control unit 100, the target shutters 14 and substrate shutter 19 are closed. In this state, the substrate holder 7 is located at the position C serving as a standby position.

Figure 5A:
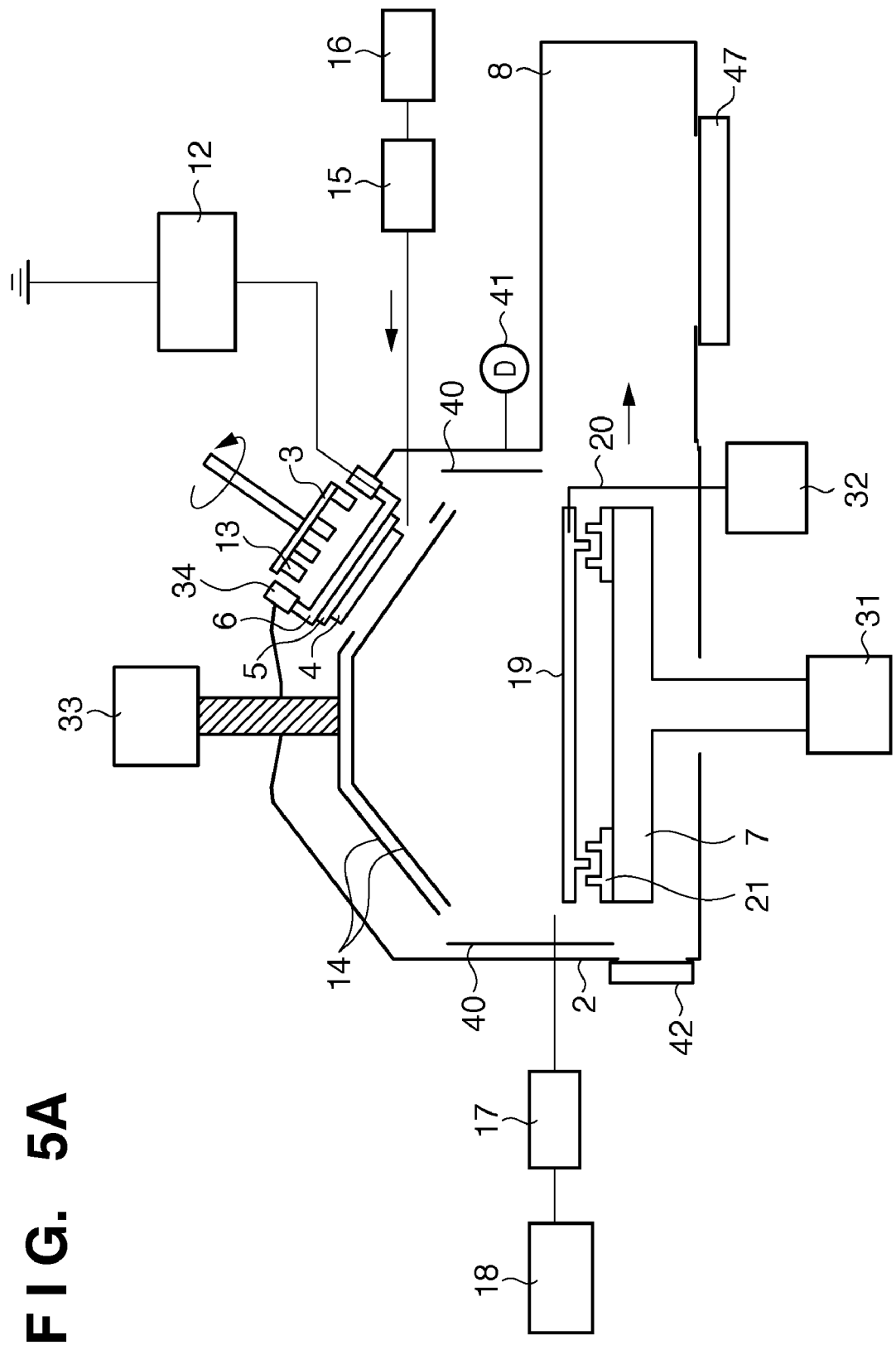
FIG. 5A is a view for explaining the operation procedure of the deposition apparatus in conditioning.

The main control unit 100 instructs the substrate holder driving mechanism 31 to perform a lift operation to lift the substrate holder 7 from the position C (FIG. 4C) serving as a standby position to the position where a labyrinth seal is formed (position A (FIG. 4A)) (FIG. 5A).

Figure 5B:
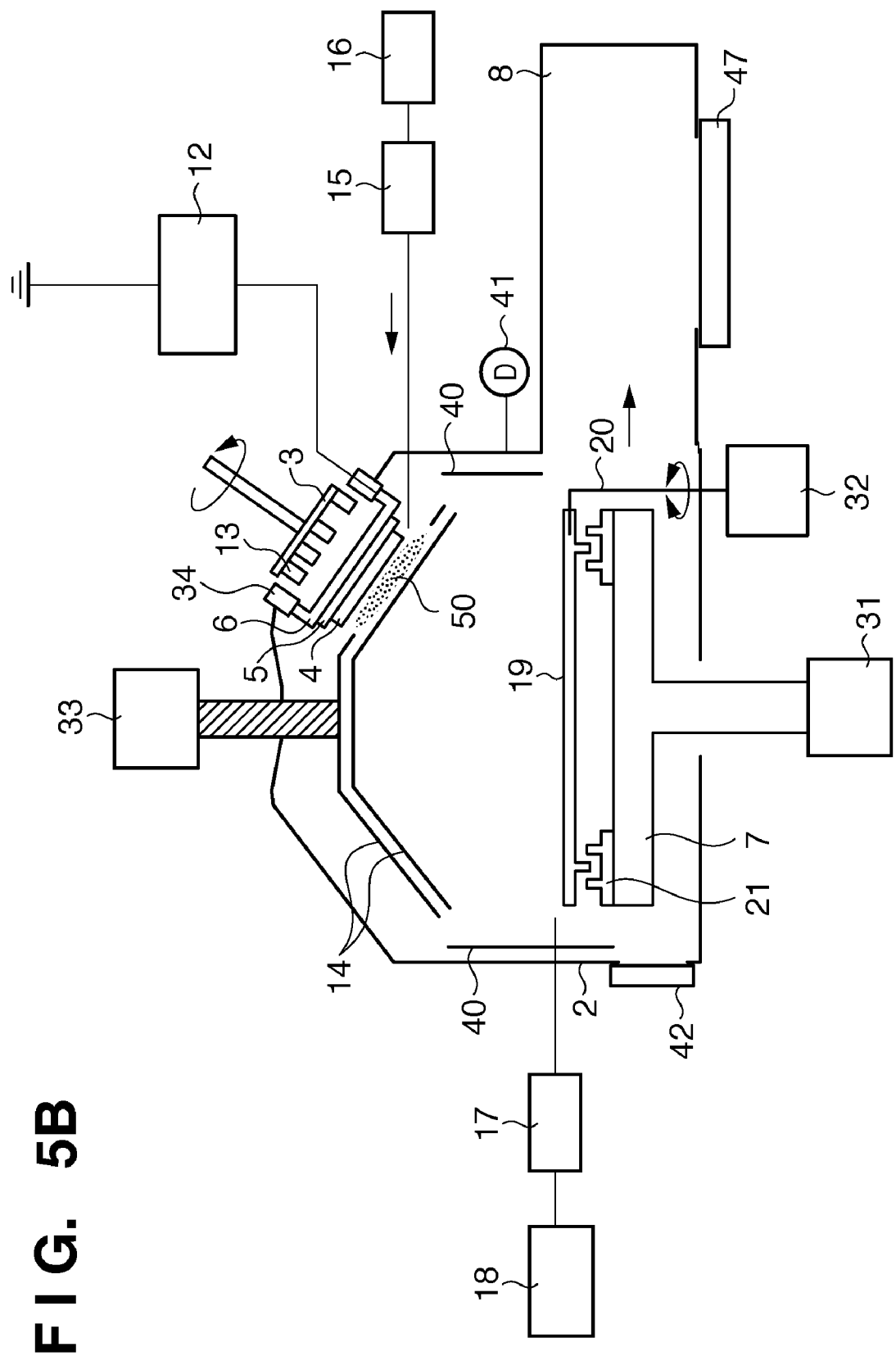
FIG. 5B is a view for explaining the operation procedure of the deposition apparatus in conditioning.

The main control unit 100 instructs the control device which controls the inert gas introduction system 15 to introduce an inert gas (Ar as well as Ne, Kr, or Xe) from the inert gas introduction system 15 in the vicinity of the target while the target shutters 14 are closed, as shown in FIG. 5B. At this time, by introducing an inert gas to the vicinity of the target, as shown in FIG. 5B, the pressure in the vicinity of the target becomes higher than that in the vicinity of the substrate, so discharge is easy in the vicinity of the target. In this state, power is supplied to the target by the power supply 12 to start discharge. At this time, a labyrinth seal is formed between the substrate shutter 19 and the substrate outer cover ring 21. This makes it possible to prevent sputtering particles from adhering onto the substrate mounting surface of the substrate holder 7.

Figure 5C:
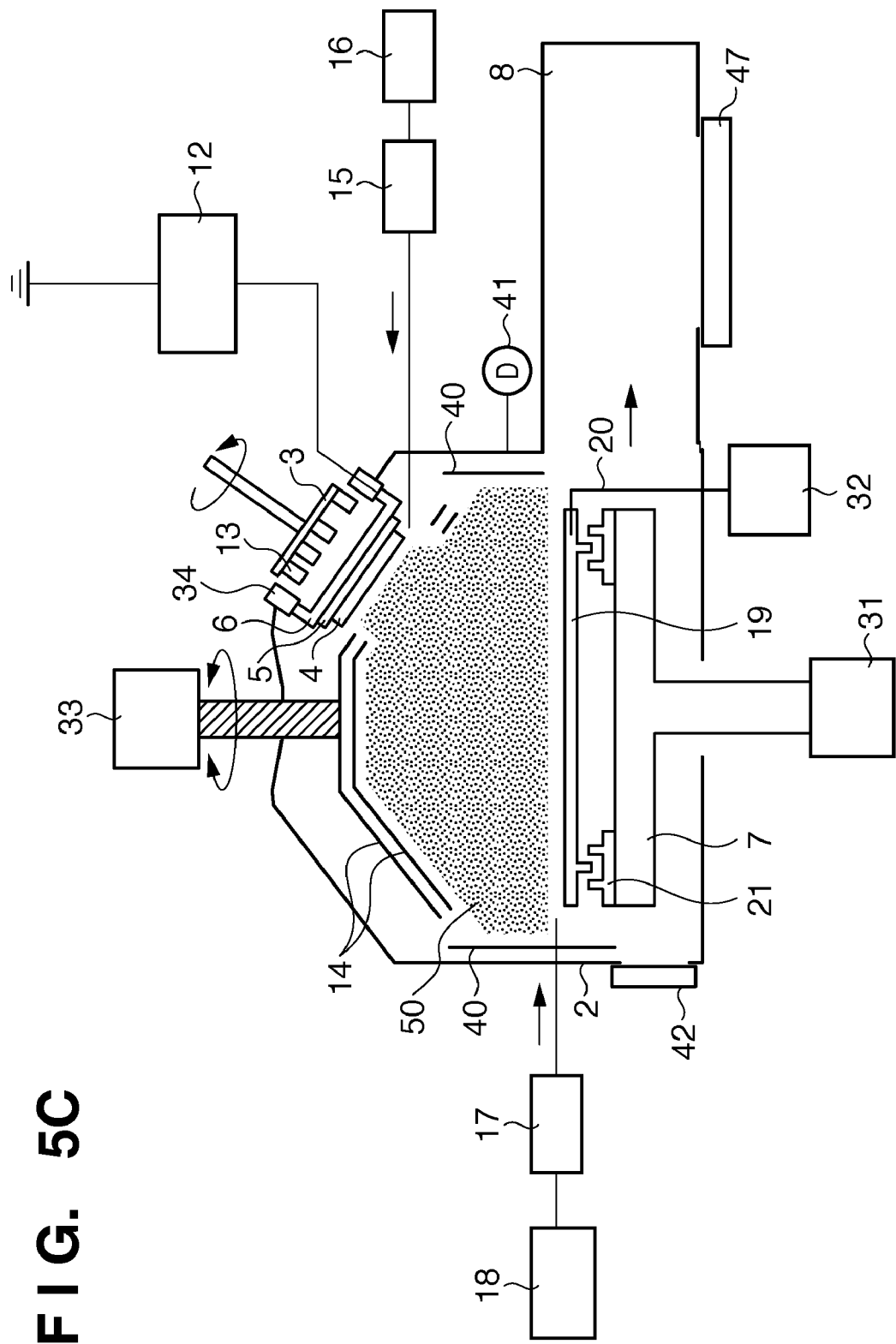
FIG. 5C is a view for explaining the operation procedure of the deposition apparatus in conditioning.

The main control unit 100 instructs the target shutter driving mechanism 33 to open the target shutters 14, as shown in FIG. 5C. With this operation, conditioning of the inner wall of the chamber starts. Sputtering particles ejected from the target 4 adhere onto the inner wall of the chamber to deposit a film on it. If the shield 40 is disposed on the inner wall, sputtering particles adhere onto the surface of the shield 40 facing the target to deposit a film on it. Nevertheless, because a labyrinth seal is formed between the substrate shutter 19 and the substrate outer cover ring 21, it is possible to prevent sputtering particles from landing on the substrate mounting surface of the substrate holder 7. In this state, so-called conditioning in which a film is formed on the inner wall of the chamber or its constituent members such as the shields takes place. A reaction between the sputtering particles and the reactive gas while the shutter is open can be stabilized by performing conditioning in this way. Note that for conditioning by reactive sputtering discharge, a reactive gas is introduced from the reactive gas introduction system 17 to the vicinity of the substrate at this time.

Figure 5D:
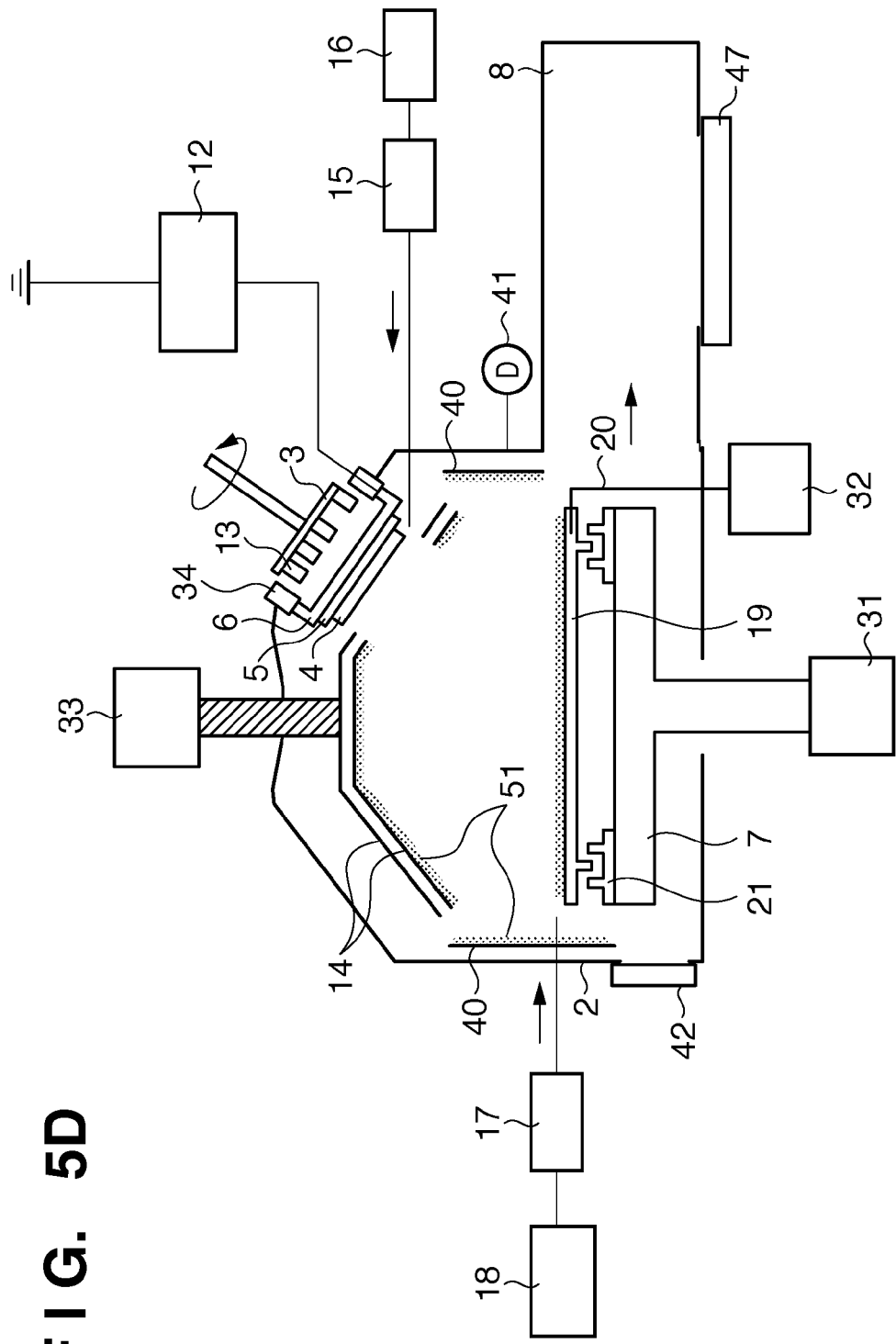
FIG. 5D is a view for explaining the operation procedure of the deposition apparatus in conditioning.

After the discharge is performed for a predetermined time, the main control unit 100 stops the power supply of the power supply 12 to stop the discharge (FIG. 5D). At this time, films 51 are deposited on the surfaces, facing the target, of the shield 40, target shutters 14, substrate shutter 19, and other members.

Figure 5E:
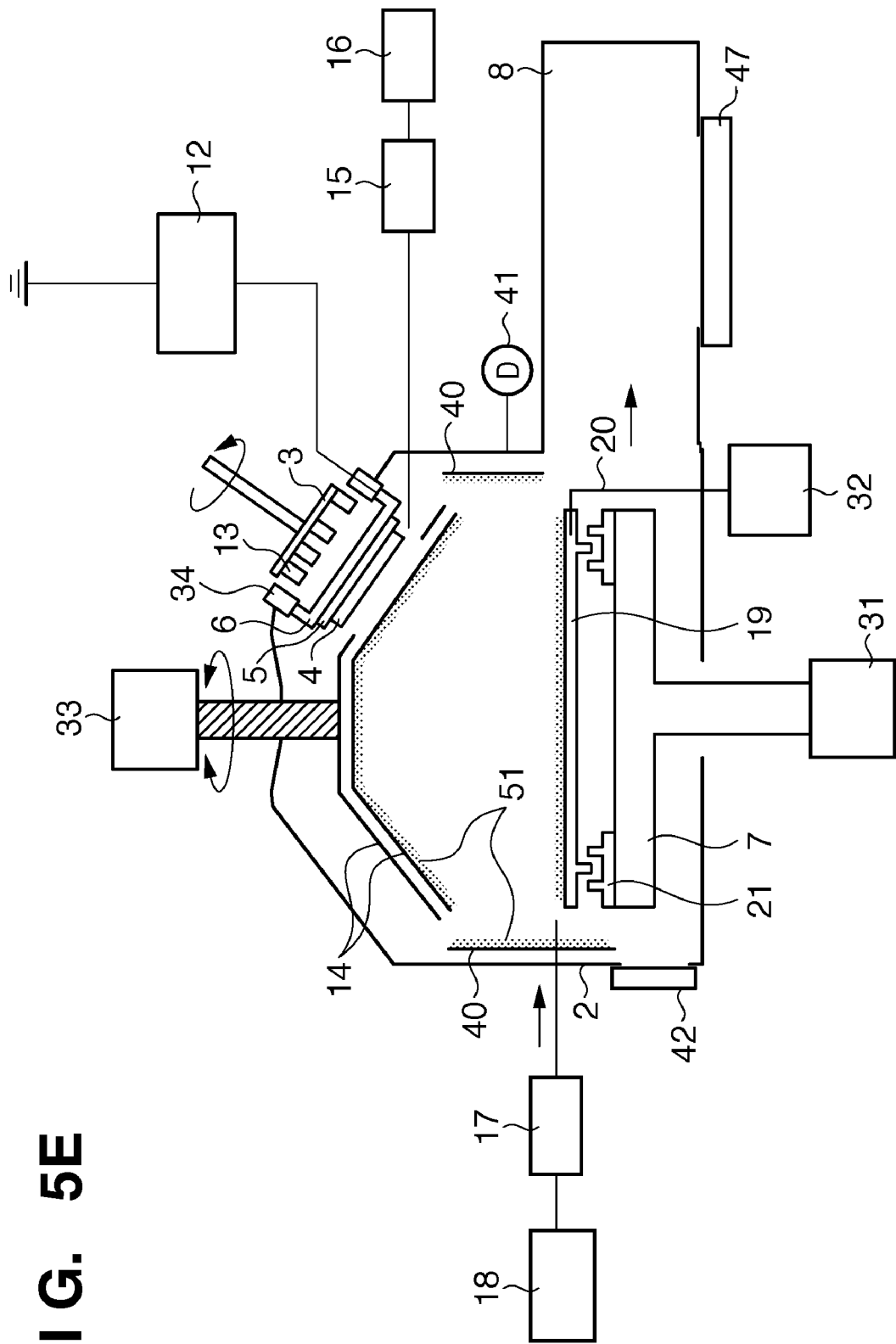
FIG. 5E is a view for explaining the operation procedure of the deposition apparatus in conditioning.

The main control unit 100 instructs the control device which controls the inert gas introduction system 15 to stop the supply of an inert gas, as shown in FIG. 5E. If a reactive gas is supplied, the main control unit 100 instructs the reactive gas introduction system 17 to stop the supply of a reactive gas as well. After that, the main control unit 100 instructs the target shutter driving mechanism 33 to close the target shutters 14 (double rotary shutters).

Figure 5F:
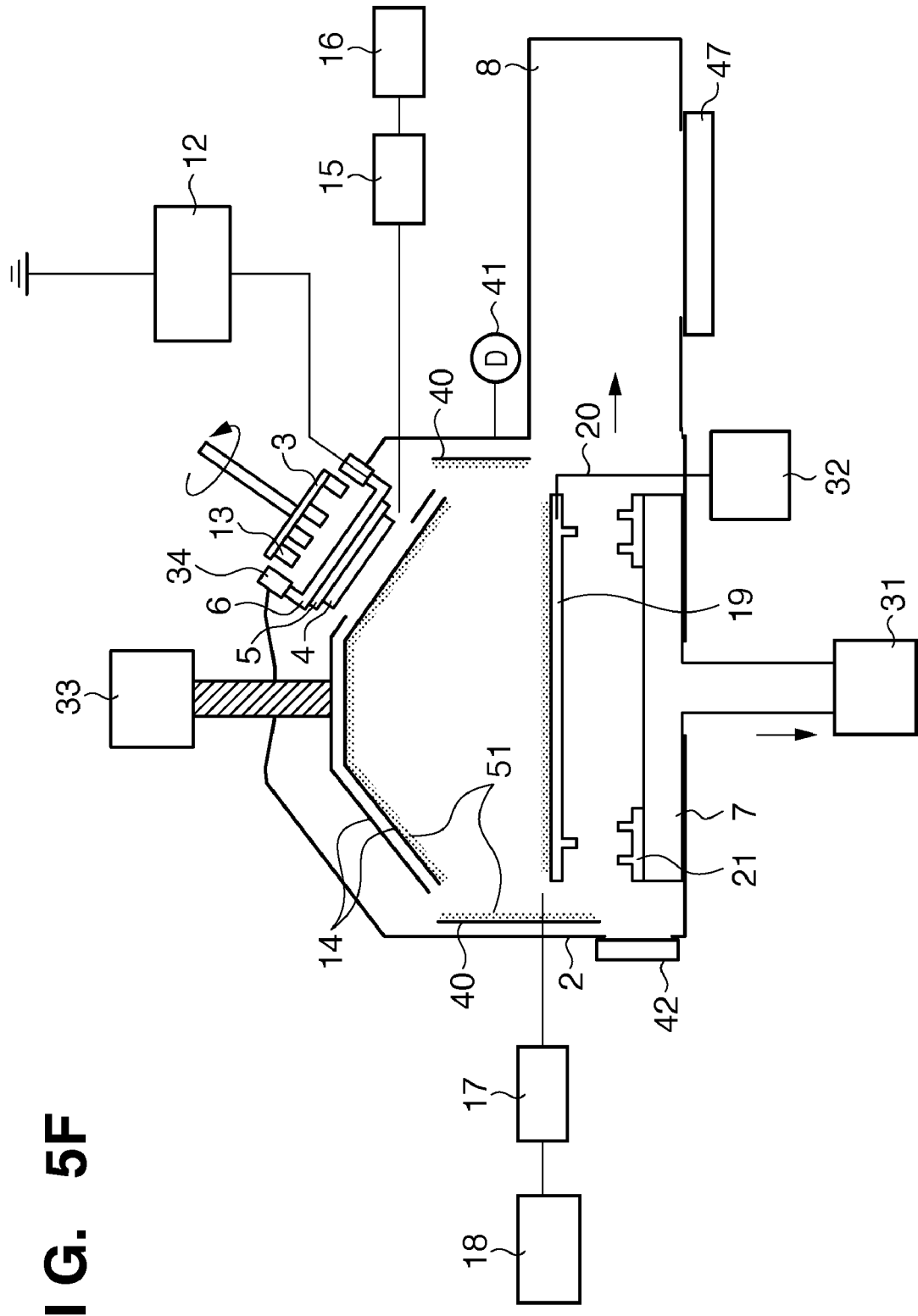
FIG. 5F is a view for explaining the operation procedure of the deposition apparatus in conditioning.

The main control unit 100 instructs the substrate holder driving mechanism 31 to move the substrate holder 7 from the position A to the position C, as shown in FIG. 5F, and the conditioning is completed.

With the foregoing procedure, conditioning can be performed while preventing sputtering particles from landing on the substrate mounting surface of the substrate holder 7.

The operation for target cleaning in which any impurities and oxides which have adhered onto the target before deposition are removed can be realized by following the same procedure as in the above-mentioned operation for conditioning.

(Pre-sputtering Operation and Deposition on Substrate)

A pre-sputtering operation and the operation of the deposition apparatus 1 in deposition on a substrate will be described next with reference to FIGS. 6A to 6I. Deposition on respective substrates is performed after pre-sputtering. The pre-sputtering mentioned herein means sputtering performed to stabilize discharge while the shutter is closed so as not to adversely affect deposition on a substrate.

Figure 6A:
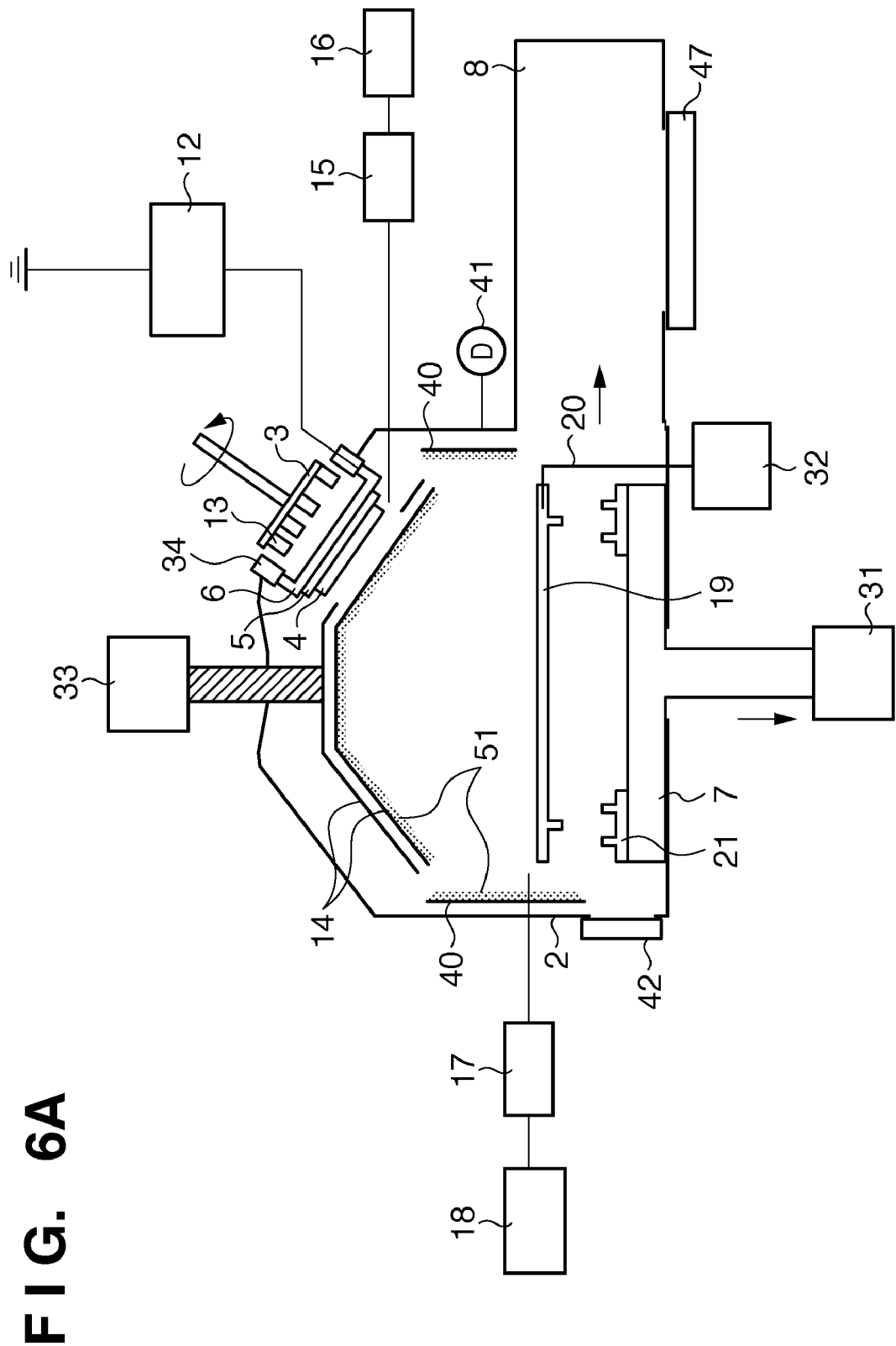
FIG. 6A is a view for explaining a pre-sputtering operation and the operation of the deposition apparatus in deposition on a substrate.

First, the main control unit 100 instructs the substrate shutter driving mechanism 32 to close the substrate shutter 19 (to form the position A). Next, the main control unit 100 instructs the target shutter driving mechanism 33 to close the target shutters 14 (double rotary shutters). In accordance with these instructions, the target shutters 14 (double rotary shutters) and substrate shutter 19 are closed (FIG. 6A). In this state, the substrate holder 7 is located at the position C serving as a standby position.

Figure 6B:
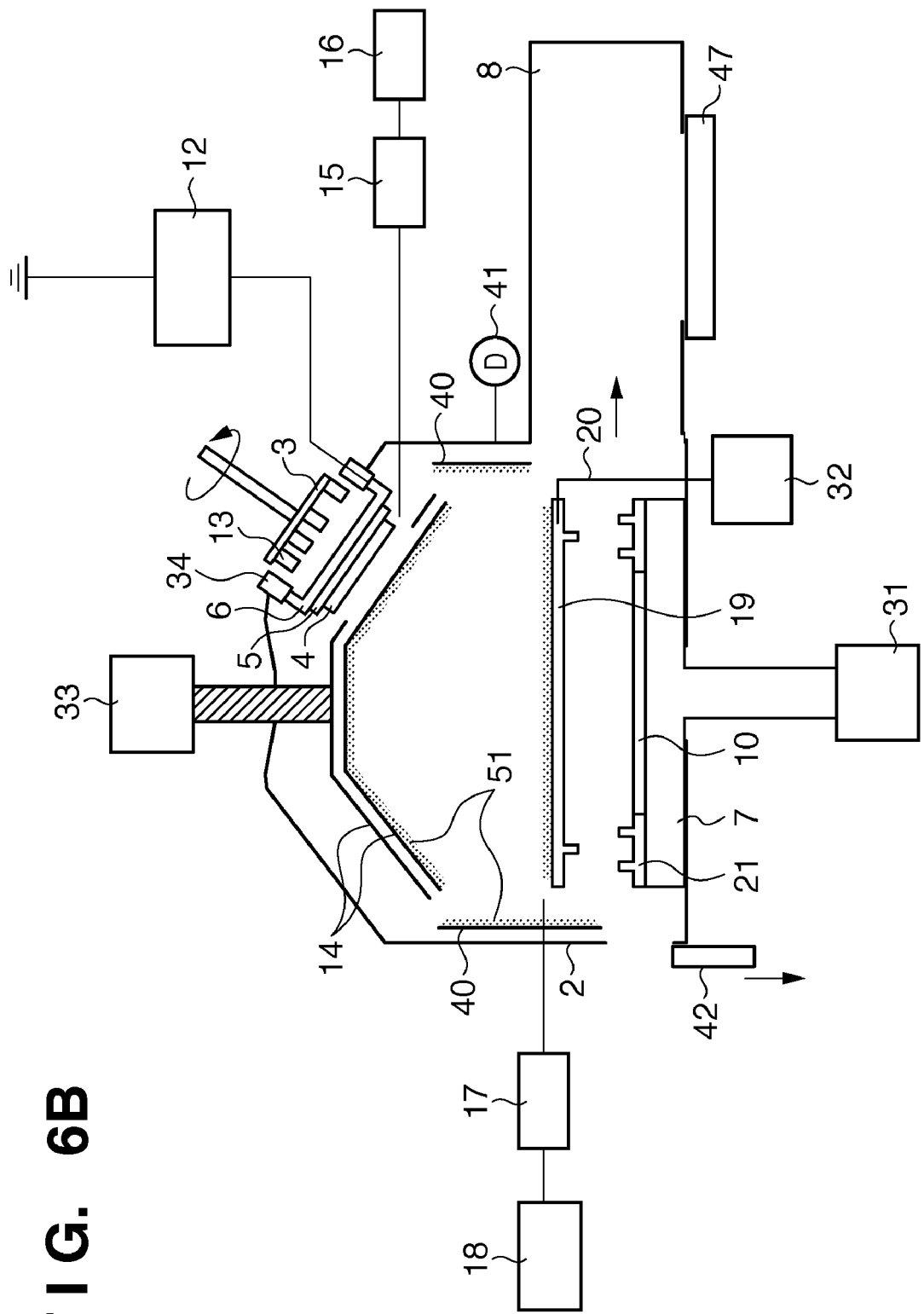
FIG. 6B is a view for explaining the pre-sputtering operation and the operation of the deposition apparatus in deposition on a substrate.

The main control unit 100 opens a gate valve 42 on the chamber wall, as shown in FIG. 6B, and instructs to load a substrate 10 from the gate valve 42 by a substrate transport unit (not shown) outside the chamber. The substrate 10 is loaded from the space between the substrate shutter 19 and the substrate outer cover ring 21, and is placed on the substrate mounting surface of the substrate holder 7 through cooperation between the substrate transport unit outside the chamber and a lift mechanism (not shown) in the substrate holder 7.

Figure 6C:
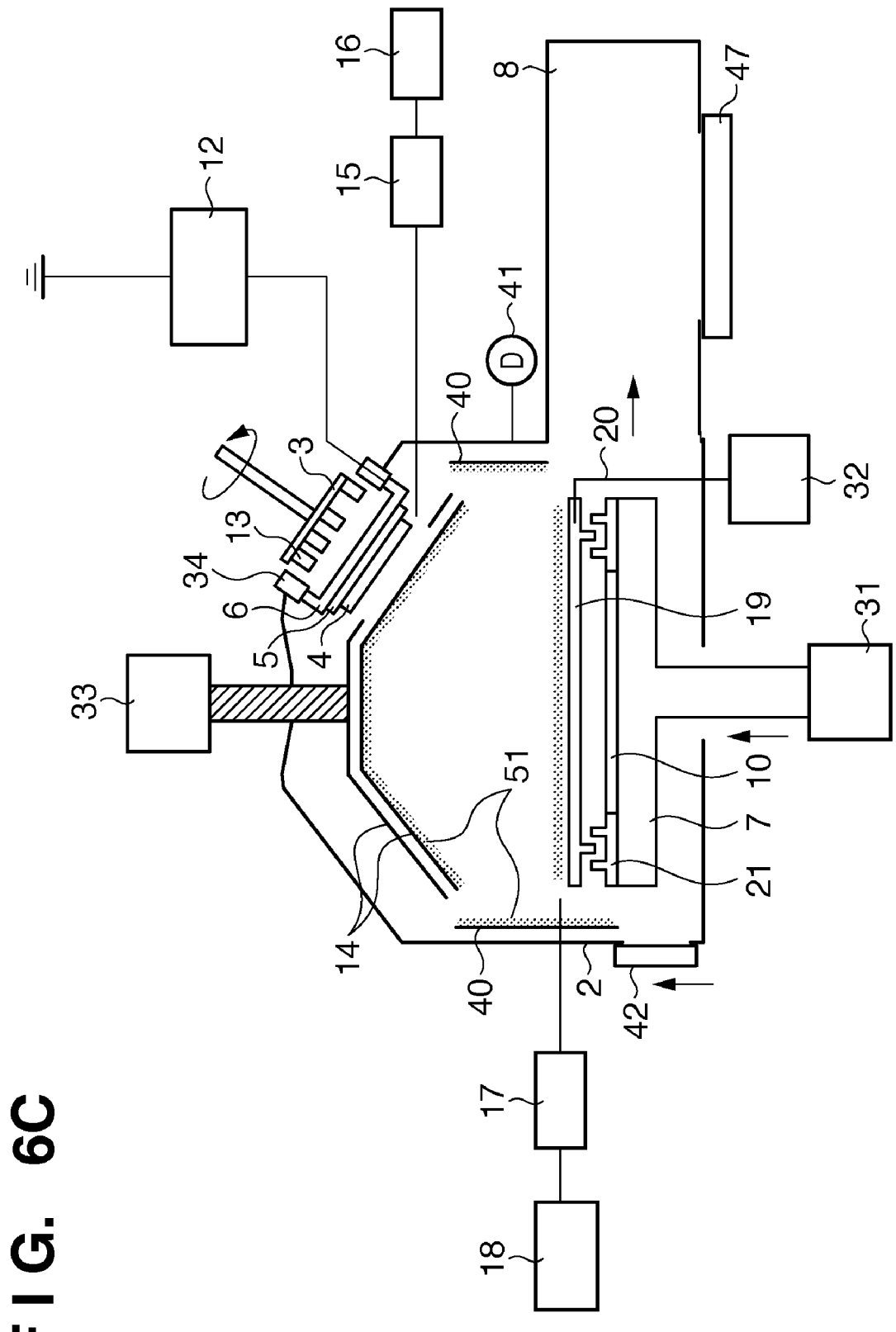
FIG. 6C is a view for explaining the pre-sputtering operation and the operation of the deposition apparatus in deposition on a substrate.

The main control unit 100 closes the gate valve 42, and causes the substrate holder driving mechanism 31 to move the substrate holder 7 from the position C (FIG. 4C) to the position B (FIG. 4B), as shown in FIG. 6C. The position B is preferably a point where the target 4 and the substrate 10 have a positional relationship optimum from the viewpoint of, for example, the deposition distribution.

Figure 6D:
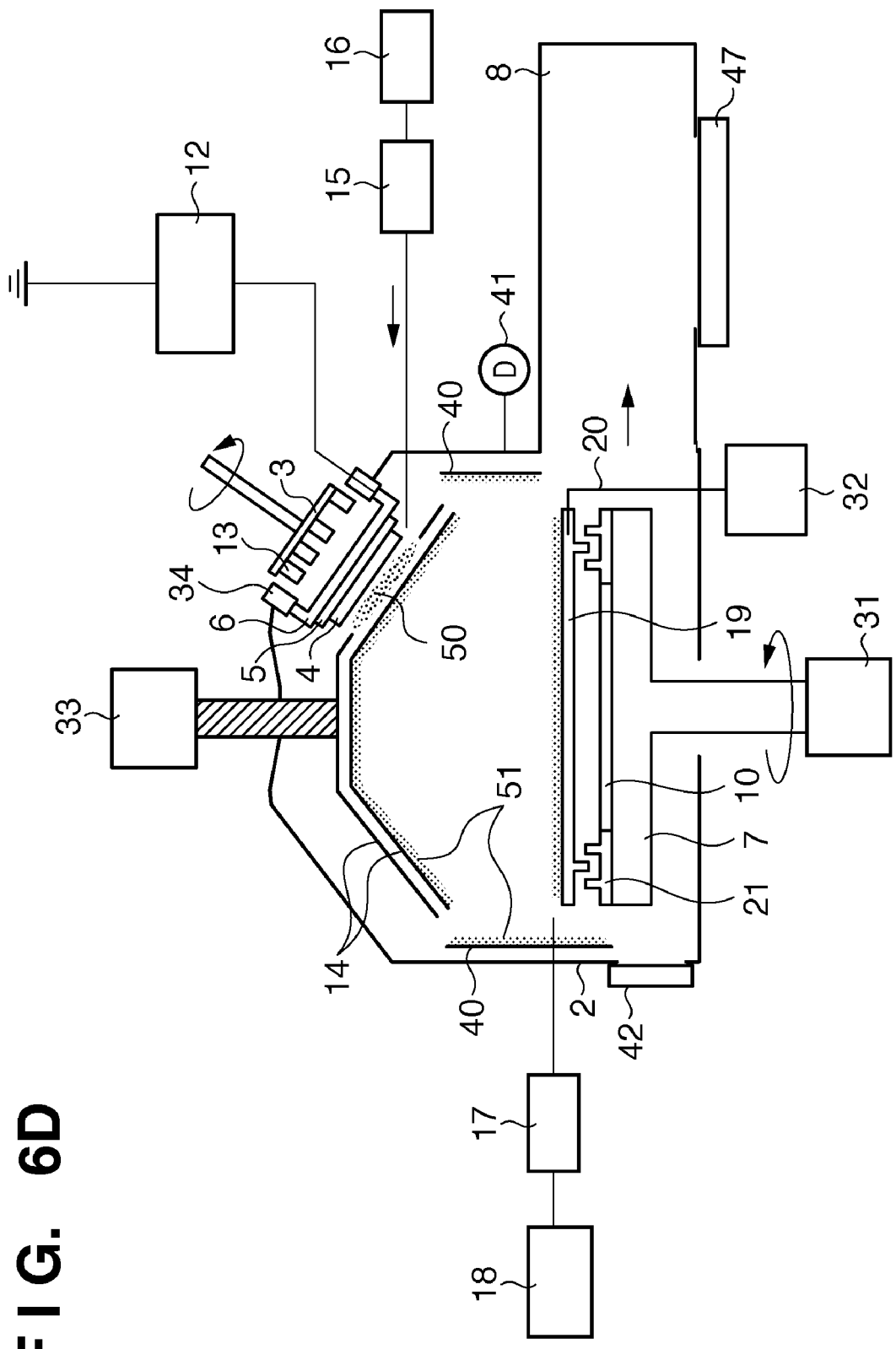
FIG. 6D is a view for explaining the pre-sputtering operation and the operation of the deposition apparatus in deposition on a substrate.

The main control unit 100 drives the substrate holder driving mechanism 31 to rotate the substrate holder 7, as shown in FIG. 6D. An inert gas (Ar as well as Ne, Kr, or Xe) is introduced from the inert gas introduction system 15 placed in the vicinity of the target. The main control unit 100 causes the power supply 12 to supply power to the target to start discharge. In this manner, when sputtering starts while the substrate shutter 19 is closed, it is possible to prevent sputtering particles from adhering onto the substrate.

Figure 6E:
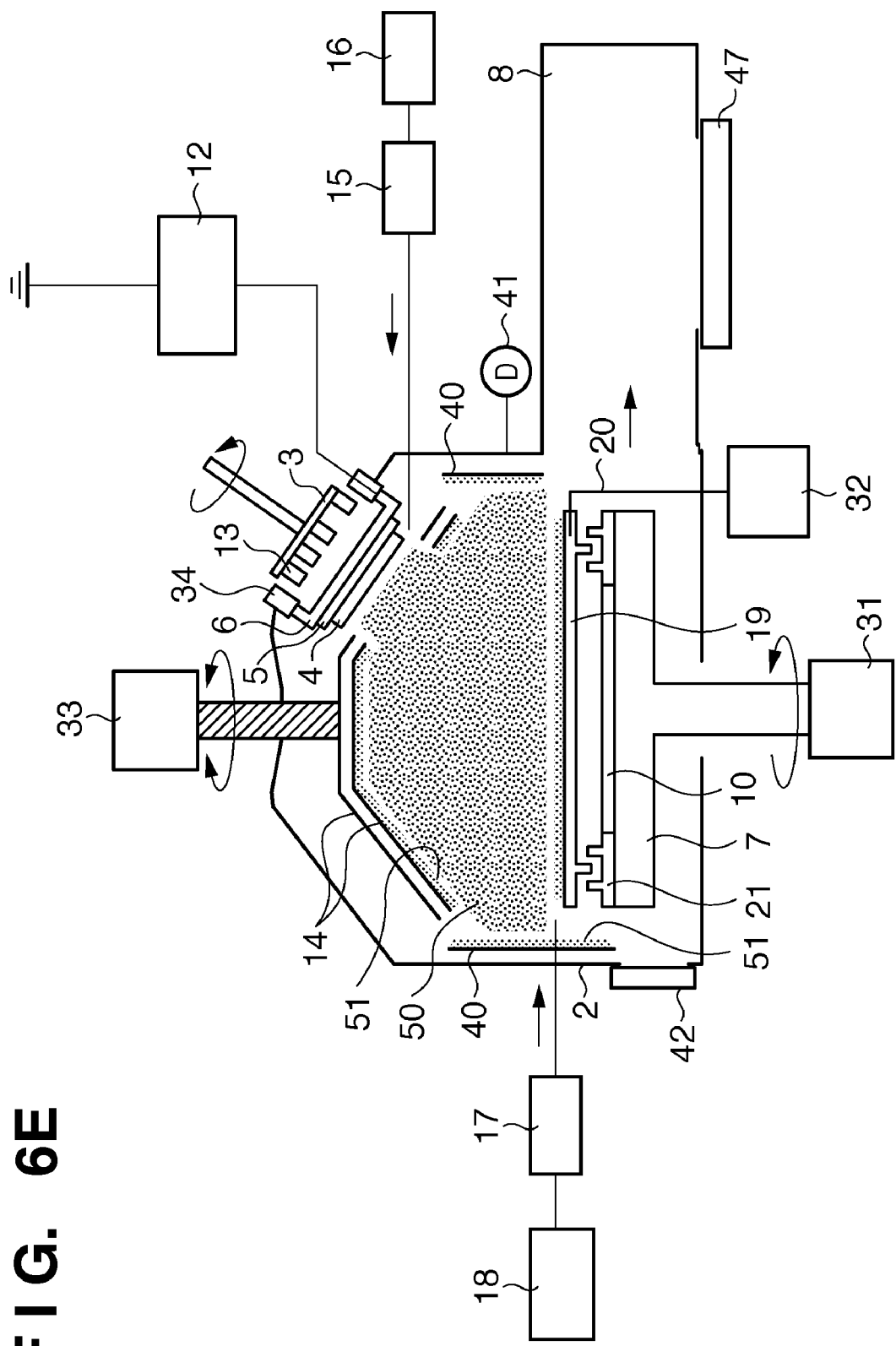
FIG. 6E is a view for explaining the pre-sputtering operation and the operation of the deposition apparatus in deposition on a substrate.

After the discharge stabilizes upon the elapse of a predetermined time (3 to 15 sec) to stabilize the discharge, the main control unit 100 opens the target shutters 14 and starts pre-sputtering, as shown in FIG. 6E. If an abnormality such as that in which discharge does not start occurs at this time, the main control unit 100 can detect it by monitoring the discharge voltage/current and stop the deposition sequence. When no problem occurs, the target shutters 14 are opened, as described above, so sputtering particles adhere onto the inner wall of the chamber to deposit a film on it. To deposit a film by reactive sputtering, a reactive gas is introduced from the reactive gas introduction system 17 in the vicinity of the substrate at this time. Sputtering particles adhere onto the shield surface of the shield 40 on the inner wall to deposit a film on it.

The functionality to prevent sputtering particles from landing on the substrate mounting surface is lower when the substrate shutter 19 is at the position B than when it is at the position A for conditioning in which the substrate shutter 19 is closed and a labyrinth seal is formed. However, the subsequent opening operation of the substrate shutter 19 at the position B can be quickly performed. In other words, because the pre-sputtering time is, for example, about 5 to 20 sec at a maximum, that is much shorter than the conditioning time (several hundreds of seconds to several thousands of seconds), and the substrate 10 has already been placed on the substrate mounting surface of the substrate holder 7, a small amount of sputtering particles poses no problem in most cases. Despite this, if a small amount of sputtering particles poses a problem for deposition, the substrate shutter 19 is set at the position A during the pre-sputtering. This makes it possible to prevent sputtering particles from landing on the substrate mounting surface during the pre-sputtering, thus depositing a high-quality film. In this state, so-called pre-sputtering discharge in which a film identical to that formed during deposition is formed on the inner wall of the chamber or its internal components such as the shields until the discharge atmosphere stabilizes takes place.

Figure 6F:
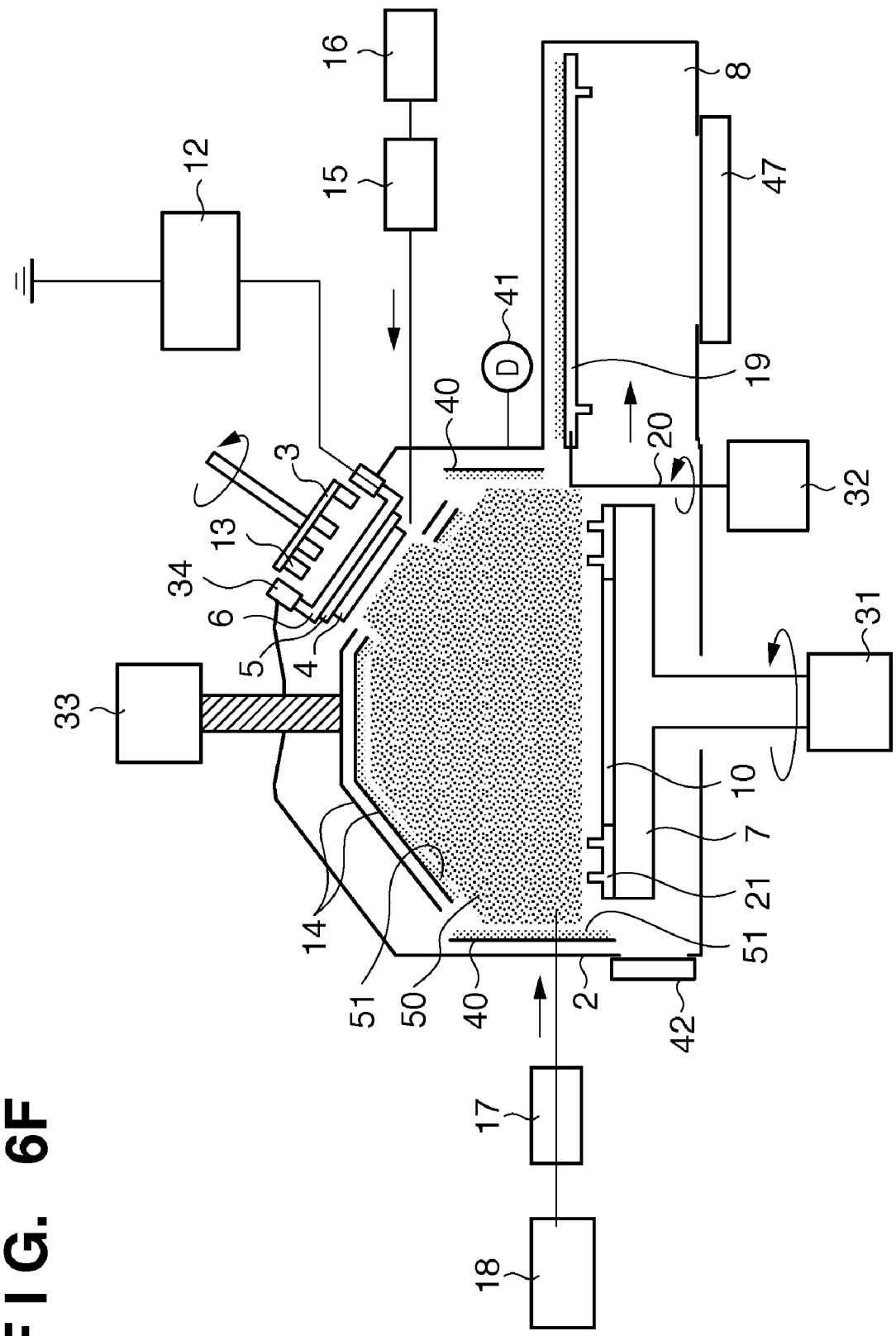
FIG. 6F is a view for explaining the pre-sputtering operation and the operation of the deposition apparatus in deposition on a substrate.

As shown in FIG. 6F, after the pre-sputtering is performed for a necessary time, the main control unit 100 causes the substrate shutter driving mechanism 32 to open the substrate shutter 19 and starts deposition on the substrate 10.

Figure 6G:
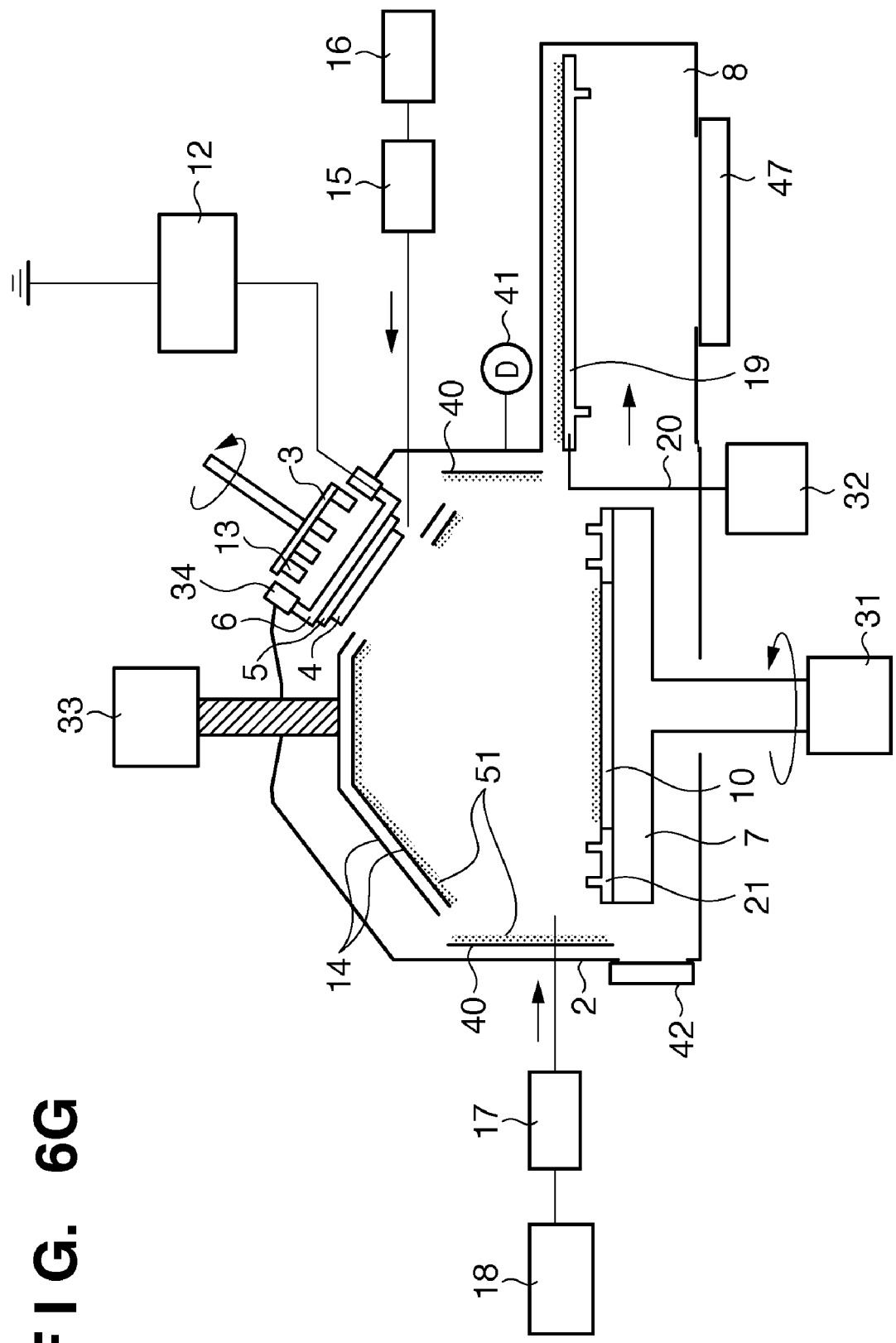
FIG. 6G is a view for explaining the pre-sputtering operation and the operation of the deposition apparatus in deposition on a substrate.
Figure 6H:
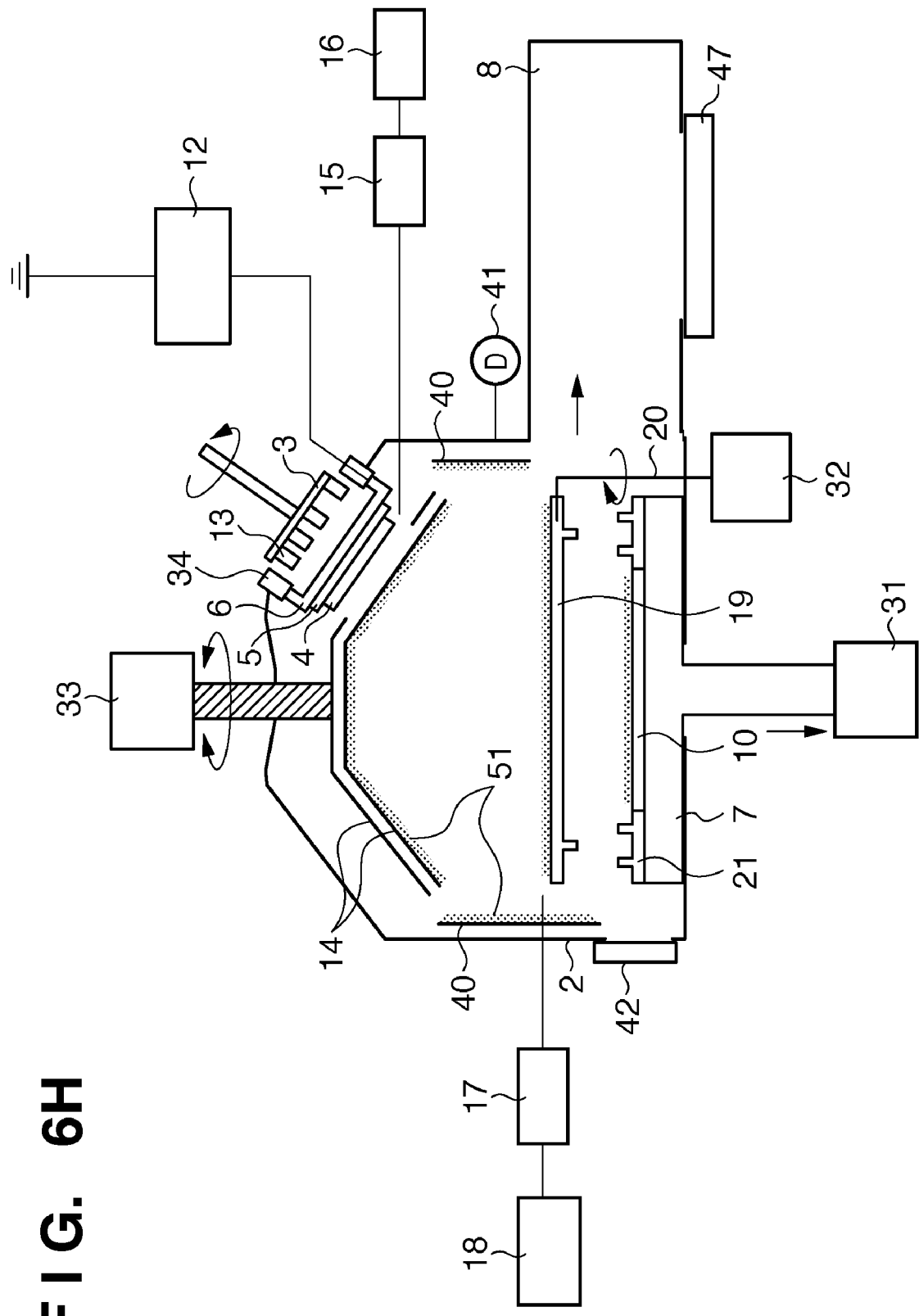
FIG. 6H is a view for explaining the pre-sputtering operation and the operation of the deposition apparatus in deposition on a substrate.

As shown in FIG. 6G, after the discharge is performed for a predetermined time, the main control unit 100 stops the voltage application to stop the discharge and stops the supply of an inert gas. If a reactive gas is supplied, the main control unit 100 stops the supply of a reactive gas as well. The main control unit 100 closes the substrate shutter 19 and the target shutters 14 (double rotary shutters). As shown in FIG. 6H, the main control unit 100 moves the substrate holder 7 from the position B to the position C.

Figure 6I:
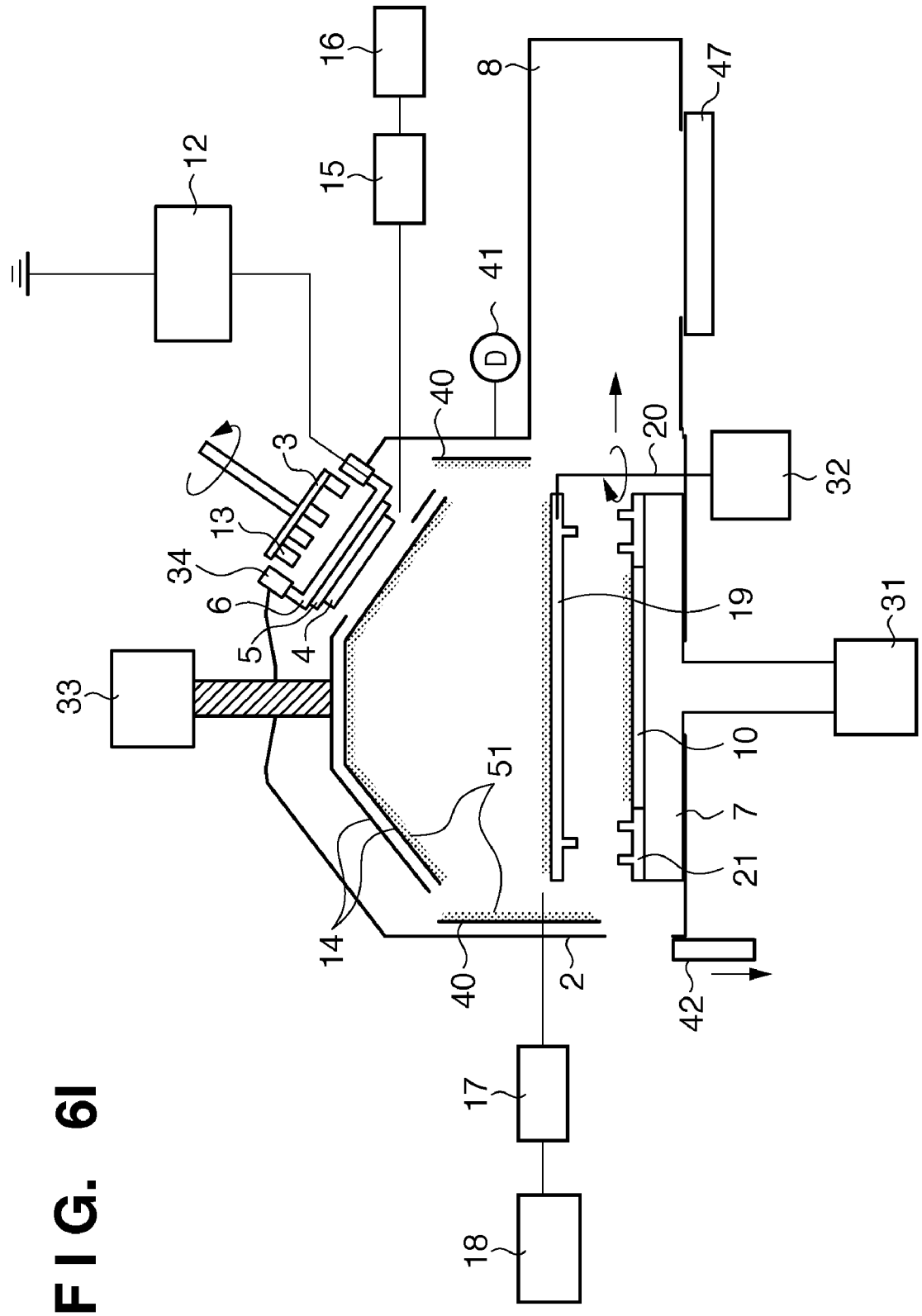
FIG. 6I is a view for explaining the pre-sputtering operation and the operation of the deposition apparatus in deposition on a substrate.

As shown in FIG. 6I, a gate valve (not shown) on the chamber is opened to unload the substrate in reverse order from the loading, and the pre-sputtering and the deposition process on a substrate are completed.

Operating the shutter mechanism by following the foregoing procedure makes it possible to prevent sputtering particles from landing on the substrate, thus depositing a high-quality film.

According to this embodiment, it is possible to provide a sputtering apparatus which prevents sputtering particles from adhering onto the substrate mounting surface of a substrate holder upon discharge aiming at conditioning, pre-sputtering, and target cleaning.

(First Modification)

A modification of a labyrinth seal formed by a substrate shutter 19 and substrate outer cover ring 21 will be described with reference to FIGS. 7A to 7G.

Figure 7A:
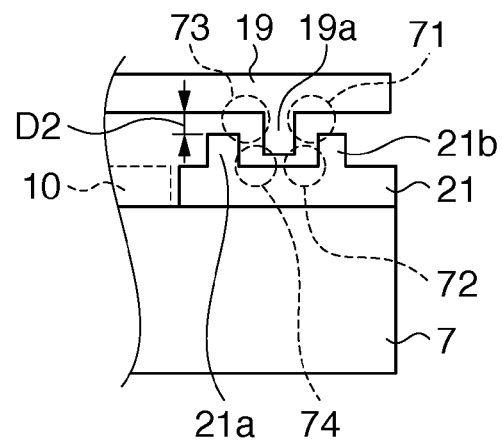
FIG. 7A is a view for explaining a modification of a labyrinth seal formed by a substrate shutter 19 and substrate outer cover ring 21.

FIG. 7A is an enlarged schematic view showing the labyrinth seal formed by the substrate shutter 19 and substrate outer cover ring 21 in the apparatus shown in FIG. 1A. In this manner, a protrusion 19a formed on the substrate shutter 19 to face the position between protrusions 21a and 21b on the substrate outer cover ring 21 can form a labyrinth seal between the substrate outer cover ring 21 and the substrate shutter 19. If the substrate outer cover ring 21 has two protrusions 21a and 21b, a seal space formed in the labyrinth seal between the protrusion 19a on the substrate shutter 19 and the protrusions 21a and 21b bends at four points surrounded by broken lines 71 to 74.

The interval of the labyrinth seal in the vertical direction, denoted by reference symbol D2 in FIG. 7A, can be changed by controlling vertical movement of a substrate holder 7. In this case, a main control unit 100 controls vertical movement of the substrate holder 7 so that the substrate outer cover ring 21 and the substrate shutter 19 do not contact with each other. Assume that the substrate outer cover ring 21 and the substrate shutter 19 come into contact with each other instead. In this case, no sputtering particles land on the substrate mounting portion of the substrate holder 7, but particles are undesirably produced from the contact portion between the substrate outer cover ring 21 and the substrate shutter 19. This is because the particles are carried to the subsequent processes, deteriorate the quality of a film deposited on a substrate to be processed, and, in turn, deteriorate the device yield and characteristics.

In opening/closing the substrate shutter 19, the main control unit 100 operates a substrate holder driving mechanism 31 to lower the substrate holder 7 up to the position (position B or C) where the protrusions 21a and 21b on the substrate outer cover ring 21 do not come into contact with the protrusion 19a on the substrate shutter 19. Such control performed by the main control unit 100 to prevent the protrusion on the substrate shutter 19 and those on the substrate outer cover ring 21 from colliding (coming into contact) with each other is common to the following modifications of the labyrinth seal.

A labyrinth seal is formed by fitting between both protrusions formed on the substrate shutter 19 and substrate outer cover ring 21 or between a protrusion and a groove formed on them. At least one of the substrate shutter 19 and the substrate outer cover ring 21 must be vertically movable. In this embodiment, the position of the substrate outer cover ring 21 can be vertically moved by vertically driving the substrate holder 7.

Each of the substrate shutter 19 and the substrate outer cover ring 21 needs to have one or more protrusions. Nevertheless, one of these members desirably has two or more protrusions from the viewpoint of preventing sputtering particles from landing on the substrate mounting surface. FIG. 7A corresponding to FIG. 1A illustrates a case in which the substrate shutter 19 has one protrusion and the substrate outer cover ring 21 has two protrusions.

Figure 7B:
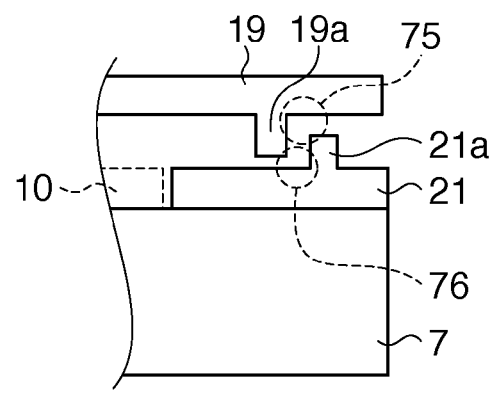
FIG. 7B is a view for explaining another modification of the labyrinth seal formed by the substrate shutter 19 and substrate outer cover ring 21.

FIG. 7B illustrates a case in which each of the substrate shutter 19 and the substrate outer cover ring 21 has one protrusion. When the substrate outer cover ring 21 has one protrusion 21a, a seal space formed in the labyrinth seal between the protrusion 19a on the substrate shutter 19 and the protrusion 21a bends at two points surrounded by broken lines 75 and 76.

Figure 7C:
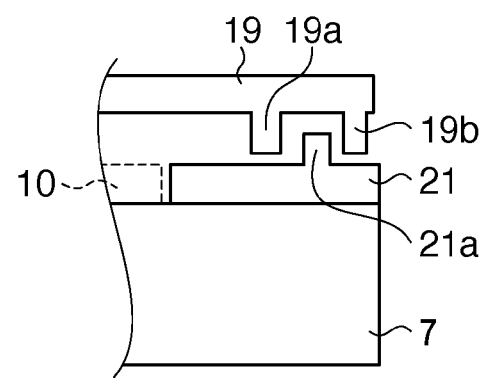
FIG. 7C is a view for explaining still another modification of the labyrinth seal formed by the substrate shutter 19 and substrate outer cover ring 21.
Figure 7D:
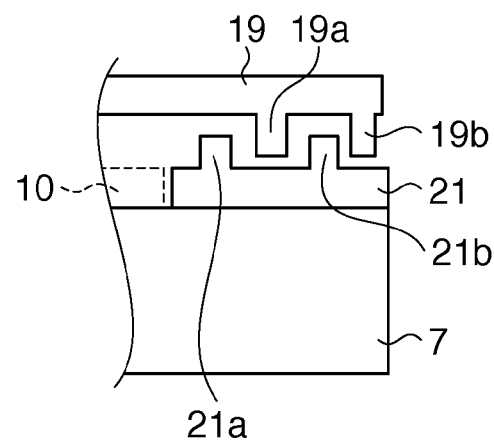
FIG. 7D is a view for explaining still another modification of the labyrinth seal formed by the substrate shutter 19 and substrate outer cover ring 21.

FIG. 7C illustrates a case in which the substrate shutter 19 has two protrusions 19a and 19b and the substrate outer cover ring 21 has one protrusion 21a. FIG. 7D illustrates a case in which the substrate shutter 19 has two protrusions 19a and 19b and the substrate outer cover ring 21 has two protrusions 21a and 21b.

Figure 7E:
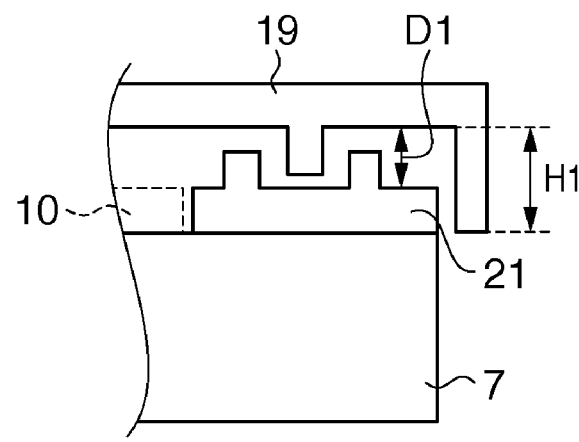
FIG. 7E is a view for explaining still another modification of the labyrinth seal formed by the substrate shutter 19 and substrate outer cover ring 21.
Figure 7F:
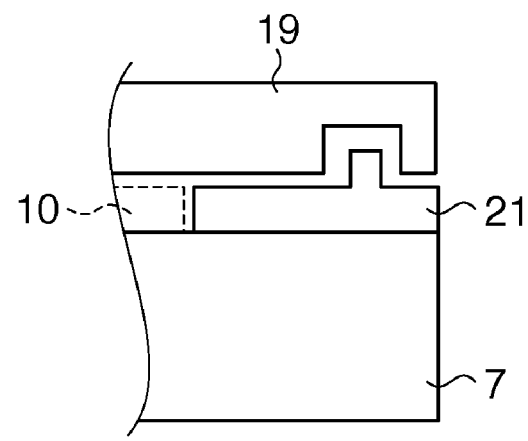
FIG. 7F is a view for explaining still another modification of the labyrinth seal formed by the substrate shutter 19 and substrate outer cover ring 21.

Also, if a plurality of protrusions are present, they have different heights as shown in, for example, FIG. 7E. Unless the substrate shutter 19 and the substrate outer cover ring 21 come into contact with each other, a given protrusion on the substrate shutter 19 may have a height H1 or H2 higher than a distance D1 between the flat surfaces of the substrate shutter 19 and substrate outer cover ring 21. FIG. 7E shows one example in which the height H1 is higher than the distance D1.

Although FIG. 7E shows an example in which the protrusions formed on the substrate shutter 19 have different heights, the present invention is not limited to this example. The protrusions on the substrate outer cover ring 21 can have different heights as well.

Also, the corners and bases of all protrusions on the substrate shutter 19 and substrate outer cover ring 21 need not always be right-angled, and may have round shapes for the sake of ease of processing and maintenance.

One of the substrate shutter 19 and the substrate outer cover ring 21 may have a groove and the other one of them may have a protrusion to form a labyrinth seal by making them face each other.

Figure 7G:
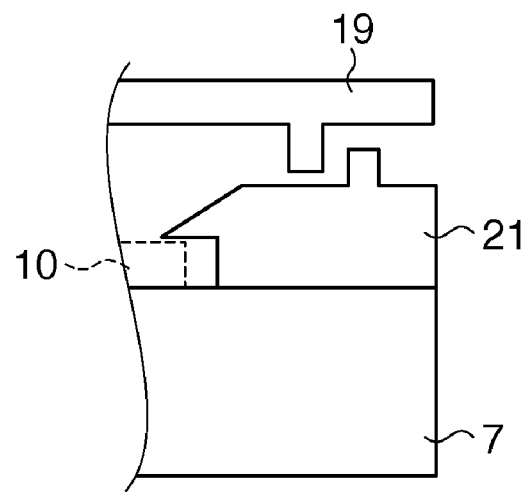
FIG. 7G is a view for explaining still another modification of the labyrinth seal formed by the substrate shutter 19 and substrate outer cover ring 21.

The substrate outer cover ring 21 functions as a mask member (shadowing member) which prevents deposition in portions (on the edge (outer periphery) of the substrate) other than the deposition surface of the substrate during deposition. To protect the edge (outer periphery) of the substrate against adhesion of sputtering particles, the substrate outer cover ring 21 may have, for example, a region where it overlaps the edge of the substrate, as shown in FIG. 7G. In this case, to prevent generation of any particles, the substrate outer cover ring 21 preferably is not contact with a substrate 10.

(Second Modification)

Figure 8:
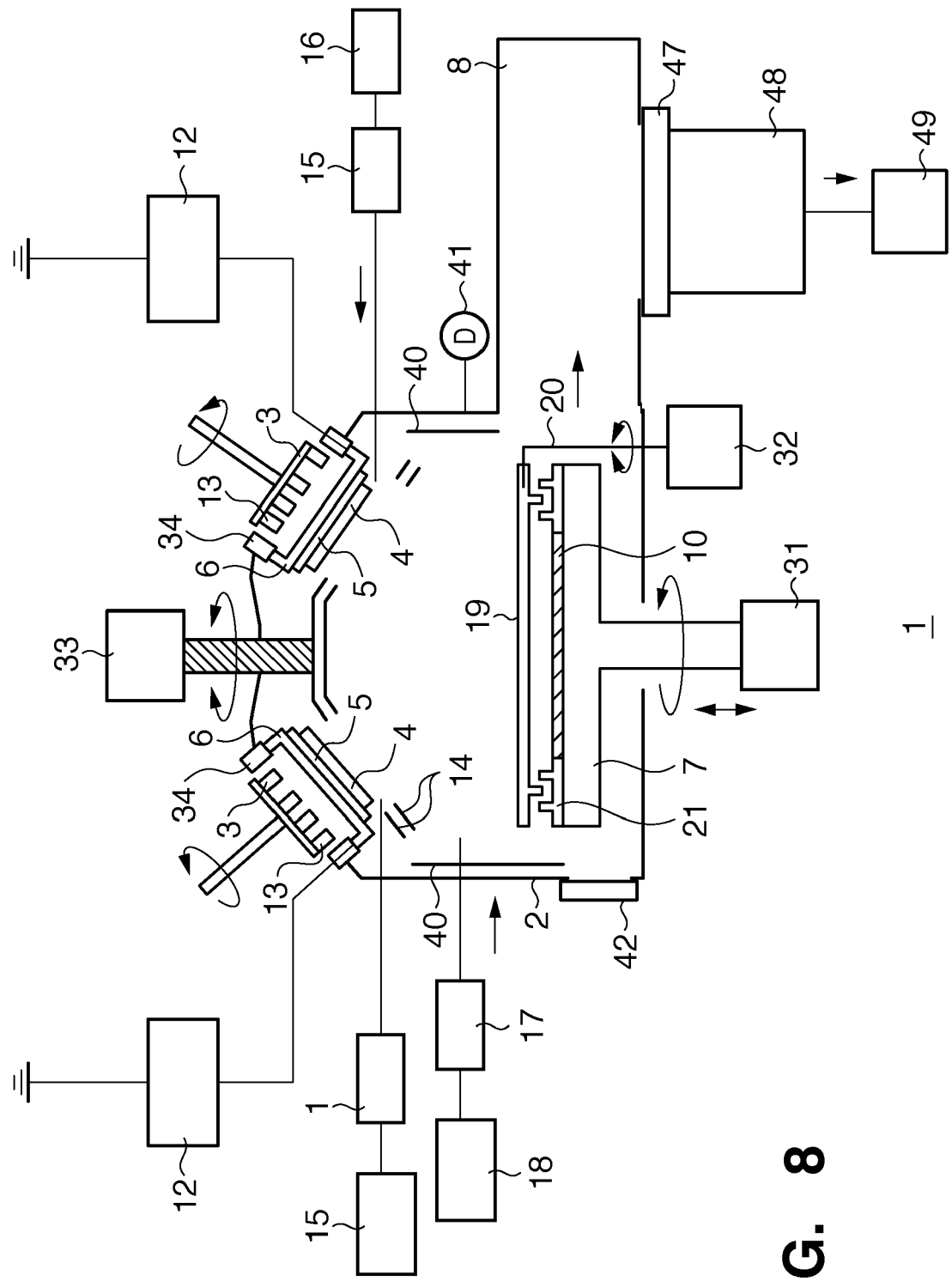
FIG. 8 is a schematic view showing a modification of the deposition apparatus 1 according to the embodiment of the present invention.

Although an example in which a single target is used has been given in the above-described embodiment, a sputtering apparatus including a plurality of targets, as shown in FIG. 8, may be adopted. In this case, to prevent contamination from one target to another target when sputtering particles from the former target adhere onto the latter target, each target needs to include a plurality of target shutters 14. This makes it possible to prevent cross-contamination between the targets.

Differences in effect corresponding to the number of protrusions will be described with reference to the following Examples.

EXAMPLE 1

A case in which the present invention is applied in preventing peel-off of TiN from the chamber wall by periodically depositing Ti on the chamber wall in TiN deposition will be described. The apparatus used is that (FIG. 1A) explained in the above-described embodiment. A target 4 was made of Ti. Protrusions on a substrate shutter 19 and substrate outer cover ring 21 were those shown in FIG. 7A. In the state shown in FIG. 7A, adopted in this Example, the substrate shutter 19 had one protrusion and the substrate outer cover ring 21 had two protrusions.

Conditioning discharge (lot pre-sputtering) before TiN deposition was performed under TiN deposition conditions (to be described later) for 1,200 sec. After that, a wafer obtained by stacking $SiO_2$ (1.5 nm)/HfSiO (1.5 nm) on a Si substrate with a diameter of 300 mm was transported to a deposition apparatus 1, was placed on a substrate holder 7, and underwent TiN deposition with a thickness of 7 nm.

The TiN deposition conditions at that time are as follows.

Ar gas is introduced as an inert gas at a flow rate of 20 sccm (sccm is an abbreviation for "standard cc per minute" and is the unit of the flow rate of gas supplied per min corresponding to the volume (unit: $cm^3$) under standard conditions defined by 0° C. and 1 atm), and $N_2$ gas is introduced as a reactive gas at a flow rate of 20 sccm, a pressure of 0.04 Pa, and a power of 700 W for a time of 240 sec.

The wafer was unloaded, the same deposition was performed for 300 wafers, the wafers were unloaded, and the processing was completed.

Conditioning was performed next. In this Example, the substrate shutter 19 had one protrusion with a height H1 of 10 mm, the substrate outer cover ring 21 had two protrusions with a height H2 of 10 mm, and the flat portions of the substrate shutter 19 and substrate outer cover ring 21 other than the protrusions had a distance D of 15 mm between them. The substrate holder 7 was located at the position A shown in FIG. 4A described earlier, and discharge started while the Ar gas was introduced at a flow rate of 50 sccm, a pressure of 0.04 Pa, and a power of 1,000 W. After that, conditioning discharge was performed for 2,400 sec by opening target shutters 14 and keeping the substrate shutter 19 closed.

Note that no substrate is normally placed on the substrate holder 7 during conditioning. However, discharge was performed by placing a 300-mm Si bare substrate on the substrate mounting surface of the substrate holder 7 in this Example for the sake of experiment.

After the discharge was completed, the 300-mm Si bare substrate placed on the substrate holder 7 was removed, and a position of 26 to 34 mm from the substrate edge was analyzed by a TXRF (Total-reflection X-Ray Fluorescence (TREX 630IIIx manufactured by Technos Co., Ltd.). The amount of detected Ti fell below a detection limit.

EXAMPLE 2

To examine the effect when the labyrinth seal has a labyrinth path shape different from that in the first embodiment, an experiment was conducted using a substrate outer cover ring 21 having a different number of protrusions, as shown in FIG. 7B, and using the same apparatus and conditions as in Example 1 as for the rest. A substrate shutter 19 used in this Example had one protrusion, and the substrate outer cover ring 21 (FIG. 7B) used in this Example had one protrusion. When an experiment was conducted under the same conditions as in Example 1, the amount of detected Ti was $2 \times 10^{10}$ atms/cm$^2$.

COMPARATIVE EXAMPLE 1

For the sake of comparison, an experiment in conditioning discharge was conducted using an apparatus, in which neither a substrate outer cover ring 21 of a substrate holder 7 nor a substrate shutter 19 includes any protrusion, that is, which includes no labyrinth seal, under the same conditions as for the rest. In this experiment, the flat portions of the substrate outer cover ring 21 and substrate shutter 19 had the same distance D between them as in Examples 1 and 2. As a result, a Ti film was formed on the surface surrounding the substrate in a visually observable amount. Since the formed Ti film was too thick to be measured by a TXRF, its thickness was measured by observing its cross-section using a TEM (Transmission Electron Microscope) and determined as about 5 nm. Note that a 5-nm thick Ti film contains Ti in an amount of about $3 \times 10^{16}$ atms/cm$^2$ assuming the density of Ti as 4.5. This reveals that a much larger amount of sputtering particles landed on the substrate mounting surface in this Comparative Example in which the no labyrinth seal was used than in Examples 1 and 2 in each of which a labyrinth seal was used.

Table 1 shows a roundup of the results of Examples 1 and 2 and Comparative Example. Note that the amount of Ti (asterisk) in Comparative Example is represented by a value converted from the film thickness.

TABLE 1

| | Number of Protrusions of Substrate Shutter | Number of Protrusions of Substrate Outer Cover Ring | Amount of Ti (atms/cm$^2$) |
|---|---|---|---|
| Example 1 | 1 | 2 | Below Detection Limit |
| Example 2 | 1 | 1 | $2 \times 10^{10}$ |
| Comparative Example | 0 | 0 | $3 \times 10^{16}$* |

The amounts of Ti in Examples 1 and 2 in each of which a labyrinth seal was used were remarkably smaller than that in Comparative Example in which no labyrinth seal was used. Further, the amount of detected Ti was smaller when the substrate outer cover ring 21 had two protrusions (the seal space bent at four points) in Example 1 than when the substrate outer cover ring 21 had only one protrusion (the seal space bent at two points) in Example 2. When one of the two members had two protrusions, that is, the labyrinth seal had a space with four bent portions, sputtering particles could be prevented from landing on the substrate mounting surface at an atomicity level higher than that when each of them had one protrusion, that is, the labyrinth seal had a space with two bent portions. Note that when the same examination was conducted for labyrinth seals shown in FIGS. 7C, 7D, 7E, and 7F, the amounts of detected Ti fell below a detection limit, as in Example 1. These labyrinth seals shown in FIGS. 7C, 7D, 7E, and 7F had four or more bent portions. That is, when a labyrinth seal has a space with four or more bent portions, an effect which is the same as or better than that in Example 1 is expected to be obtained.

Although preferred embodiments of the present invention have been described above with reference to the accompanying drawings, the present invention is not limited to these embodiments, and can be changed into various forms within the technical scope understood from a description of the scope of claims.

This application claims priority based on Japanese Patent Application No. 2008-305566, filed Nov. 28, 2008, which is hereby incorporated by reference herein in its entirety.

The invention claimed is:

1. A sputtering apparatus comprising:
a target holder which is placed in a vacuum vessel and can hold a target configured to deposit a film on a substrate;
a substrate holder which can mount the substrate;
a first shield member which is disposed in a vicinity of said substrate holder, and configured to form a closed state in which said substrate holder and said target holder are shielded from each other, or an open state in which said substrate holder and said target holder are opened to each other;
a first opening/closing driving unit adapted to open/close said first shield member to enter the open state or the closed state;
a second shield member, having an annular-shape, disposed on a surface of said substrate holder and an outer peripheral portion of the substrate; and
a driving unit adapted to move said substrate holder in order to bring said substrate holder, on which said second shield member is disposed, close to said first shield member in the closed state,
wherein said first shield member has at least one annular-shaped, first protruding portion formed thereon to extend in a direction of said second shield member,
said second shield member has at least one annular-shaped, second protruding portion formed thereon to extend in a direction of said first shield member, and
the first protruding portion and the second protruding portion fit together in a non-contact state at a position up to which said driving unit brings said substrate holder close to said first shield member.

2. The sputtering apparatus according to claim 1, wherein a distance between said first shield member and said second shield member is smaller than a sum of a height of the first protruding portion and a height of the second protruding portion at the position up to which said driving unit brings said substrate holder close to said first shield member.

3. A sputtering apparatus comprising:
a target holder which is placed in a vacuum vessel and can hold a target configured to deposit a film on a substrate;
a substrate holder which can mount the substrate;
a first shield member which is disposed in a vicinity of said substrate holder, and configured to form a closed state in which said substrate holder and said target holder are shielded from each other, or an open state in which said substrate holder and said target holder are opened to each other;
a first opening/closing driving unit adapted to open/close said first shield member to enter the open state or the closed state;
a second shield member, having an annular-shape, disposed on a surface of said substrate holder and an outer peripheral portion of the substrate; and
a driving unit adapted to move said first shield member in order to bring said first shield member in the closed state, close to said substrate holder on which said second shield member is disposed,
wherein said first shield member has at least one annular-shaped, first protruding portion formed thereon to extend in a direction of said second shield member,
said second shield member has at least one annular-shaped, second protruding portion formed thereon to extend in a direction of said first shield member, and
the first protruding portion and the second protruding portion fit together in a non-contact state at a position up to which said driving unit brings said first shield member close to said substrate holder.

4. The sputtering apparatus according to claim 3, wherein a distance between said first shield member and said second shield member is smaller than a sum of a height of the first protruding portion and a height of the second protruding portion at the position up to which said driving unit brings said first shield member close to said second shield member.

5. The sputtering apparatus according to claim 1, wherein at least one of the first protruding portion on said first shield member and the second protruding portion on said second shield member includes a plurality of protruding portions, and the first protruding portion or the second protruding portion fits in a groove formed by the plurality of protruding portions included in the other the first protruding portion or the second protruding portion in a non-contact state.

6. The sputtering apparatus according to claim 1, wherein each of the first protruding portion on said first shield member and the second protruding portion on said second shield member includes a plurality of protruding portions, and the first protruding portion or the second protruding portion fits into a groove formed by the plurality of protruding portions included in the other the first protruding portion or the second protruding portion.

7. The sputtering apparatus according to claim 1, further comprising:
a third shield member which is disposed in a vicinity of said target holder, and forms an open state in which said substrate holder and said target holder are shielded from each other, or an open state in which said substrate holder and said target holder are opened to each other; and
a second opening/closing driving unit adapted to open/close said third shield member to enter the open state or the closed state.

8. The sputtering apparatus according to claim 2, wherein said third shield member has a double rotary shutter structure including two independently openable/closable shutter members.

9. The sputtering apparatus according to claim 3, wherein at least one of the first protruding portion on said first shield member and the second protruding portion on said second shield member includes a plurality of protruding portions, and the first protruding portion or the second protruding portion fits in a groove formed by the plurality of protruding portions included in the other the first protruding portion or the second protruding portion in a non-contact state.

10. The sputtering apparatus according to claim 3, wherein each of the first protruding portion on said first shield member and the second protruding portion on said second shield member includes a plurality of protruding portions, and the first protruding portion or the second protruding portion fits into a groove formed by the plurality of protruding portions included in the other the first protruding portion or the second protruding portion.

11. The sputtering apparatus according to claim 3, further comprising:
   a third shield member which is disposed in a vicinity of said target holder, and forms an open state in which said substrate holder and said target holder are shielded from each other, or an open state in which said substrate holder and said target holder are opened to each other; and
   a second opening/closing driving unit adapted to open/close said third shield member to enter the open state or the closed state.

12. The sputtering apparatus according to claim 11, wherein said third shield member has a double rotary shutter structure including two independently openable/closable shutter members.

* * * * *